United States Patent [19]
Konishi et al.

[11] Patent Number: 5,200,737
[45] Date of Patent: Apr. 6, 1993

[54] SYSTEM AND METHOD FOR DETECTING PARTIAL DISCHARGE OF GAS-INSULATED SWITCHGEAR

[75] Inventors: Katsumi Konishi, Chiba; Takaaki Sakakibara, Kanagawa, Japan

[73] Assignee: Kabushiki Kaisha Toshiba, Kawasaki, Japan

[21] Appl. No.: 799,945

[22] Filed: Nov. 29, 1991

[30] Foreign Application Priority Data

Nov. 30, 1990 [JP] Japan ................................. 2-336733

[51] Int. Cl.$^5$ ........................................ G01R 31/06
[52] U.S. Cl. .................................... 340/644; 324/424; 324/536; 324/535; 324/455; 324/456; 324/514; 324/520; 324/547; 361/85; 361/86; 361/87; 340/646; 340/647
[58] Field of Search ................ 361/84, 85, 86, 87; 340/644, 646, 647, 658; 324/424, 455, 456, 514, 520, 536, 547, 552, 535

[56] References Cited

U.S. PATENT DOCUMENTS

| | | | |
|---|---|---|---|
| 3,775,676 | 11/1973 | Harrold | 324/523 |
| 3,801,899 | 4/1974 | Liao | 324/536 |
| 4,095,173 | 6/1978 | Darrel | 324/535 |
| 4,238,733 | 12/1980 | Freeman | 324/536 |
| 4,245,187 | 1/1981 | Wagner | 324/553 |
| 4,446,420 | 5/1984 | Drouet | 324/536 |
| 4,547,769 | 10/1985 | Tanigaki | 340/644 |
| 4,670,812 | 6/1987 | Doerfler | 361/89 |
| 5,107,447 | 4/1992 | Ozawa | 324/544 |

Primary Examiner—Kenneth A. Weider
Assistant Examiner—Jose M. Solis
Attorney, Agent, or Firm—Oblon, Spivak, McClelland, Maier & Neustadt

[57] ABSTRACT

A system and method for detecting partial discharge of gas-insulated switchgear wherein a high-frequency component and the fundamental wave component of the voltage applied to the conductor of the gas-insulated switchgear are detected, the zero-cross point of the fundamental wave component is set as the starting point for the voltage, and the presence of partial discharge and the reason for the occurrence of partial discharge are ascertained based on the phase difference between the phase of the detected high-frequency component and the phase of the starting point of the voltage.

16 Claims, 18 Drawing Sheets

| REASON FOR PARTIAL DISCHARGE | | PARTIAL DISCHARGE PULSE PATTERN | |
|---|---|---|---|
| | | STARTING | CONTINUING |
| 1 | 1-1 BUBBLE  |  |  |
| | 1-2 GAP  |  |  |
| 2 | PROJECTION INTO GAS-FILLED REGION |  |  |
| 3 | SMALL LOOSE PARTICLES |  |  |
| 4 | POOR CONTACT |  |  |

REASON 1-1 (STARTING)

REASON 1-2 (STARTING)

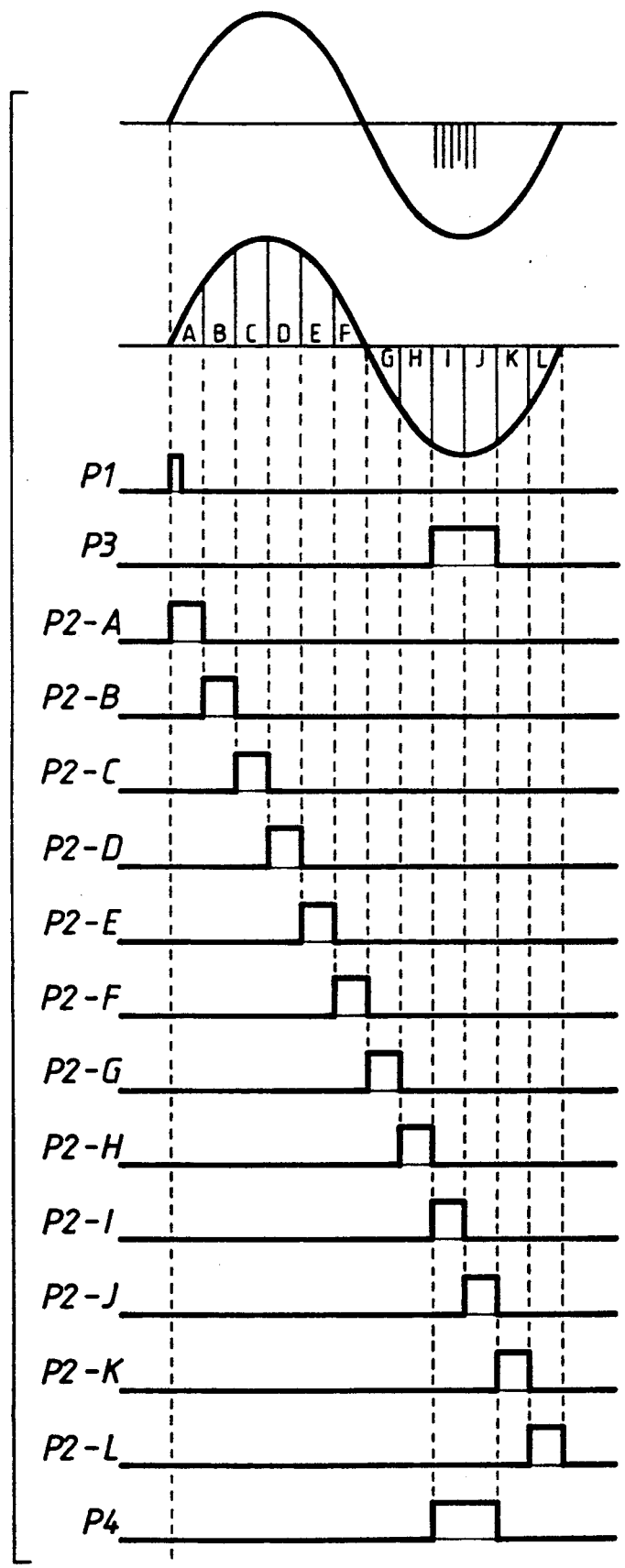
Fig.4C. REASON 2 (STARTING)

REASON 3 (STARTING)

REASON 4 (STARTING)

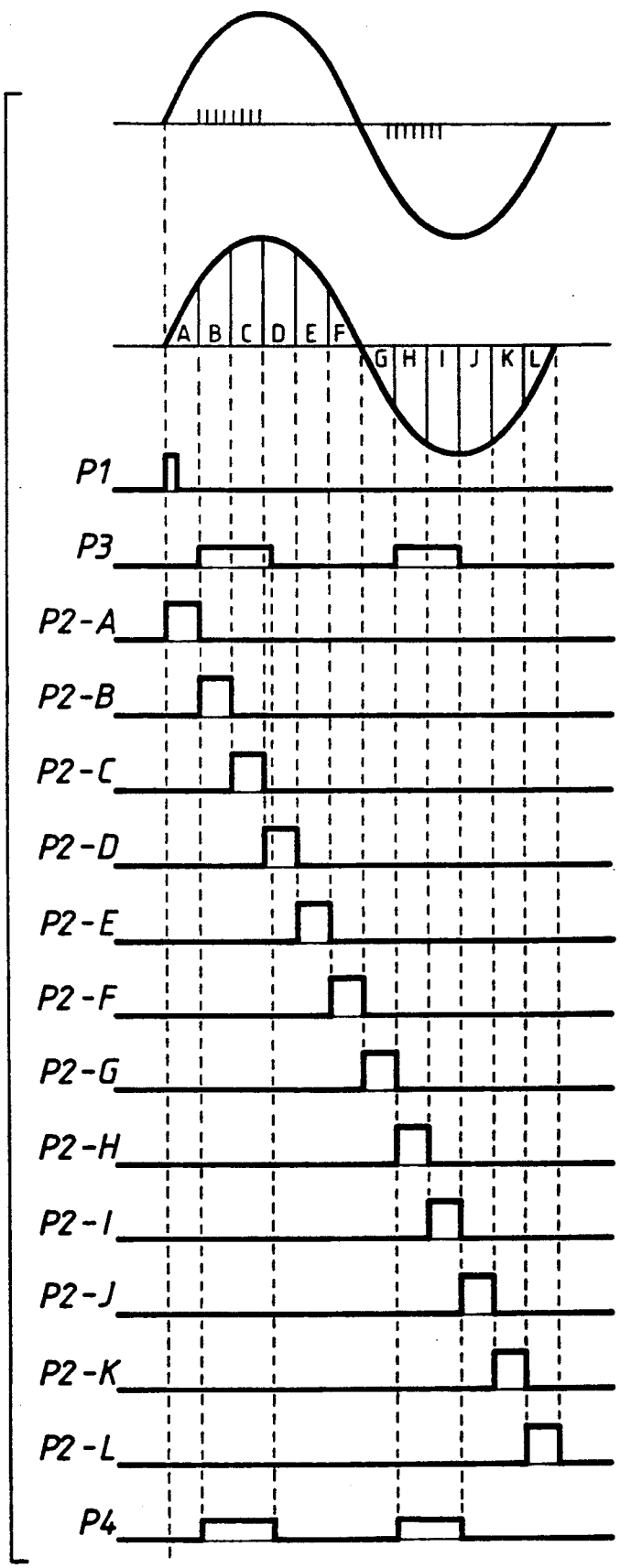
Fig.4F. REASON 1-1 (CONTINUING)

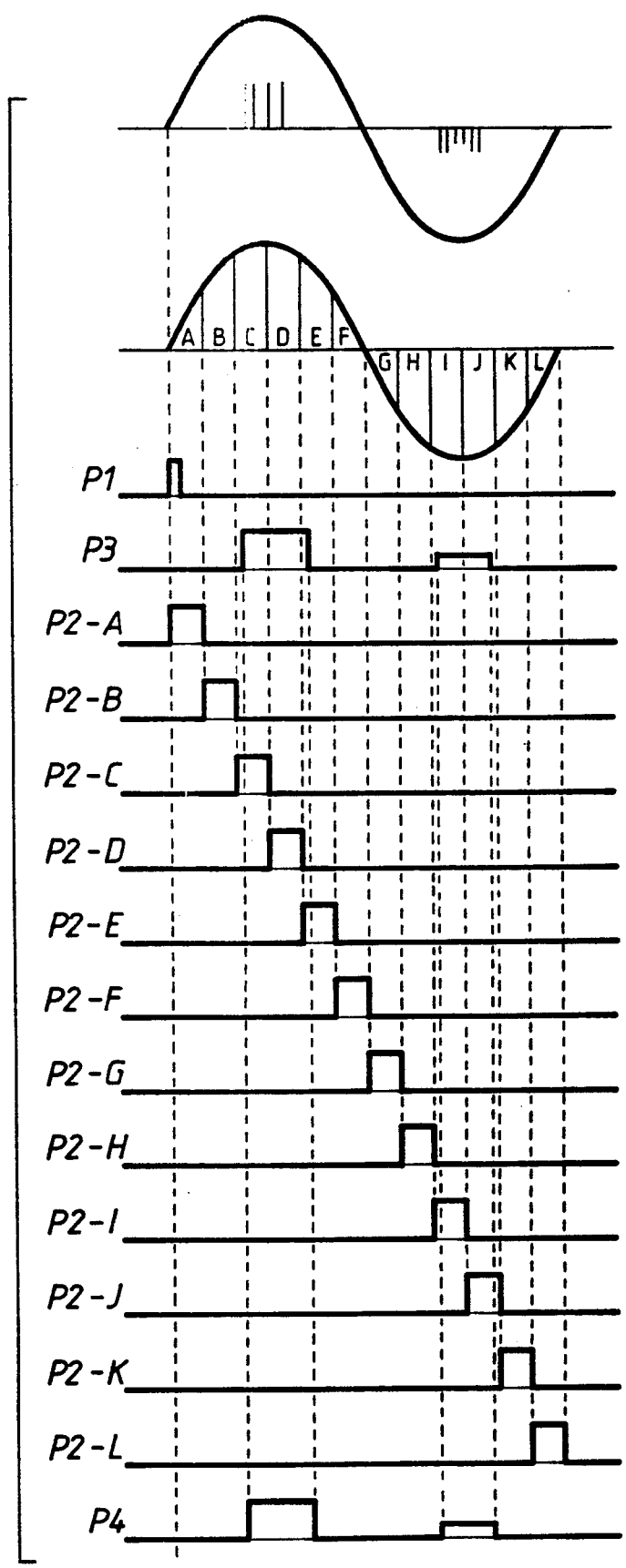
Fig. 4H. REASON 2 (CONTINUING)

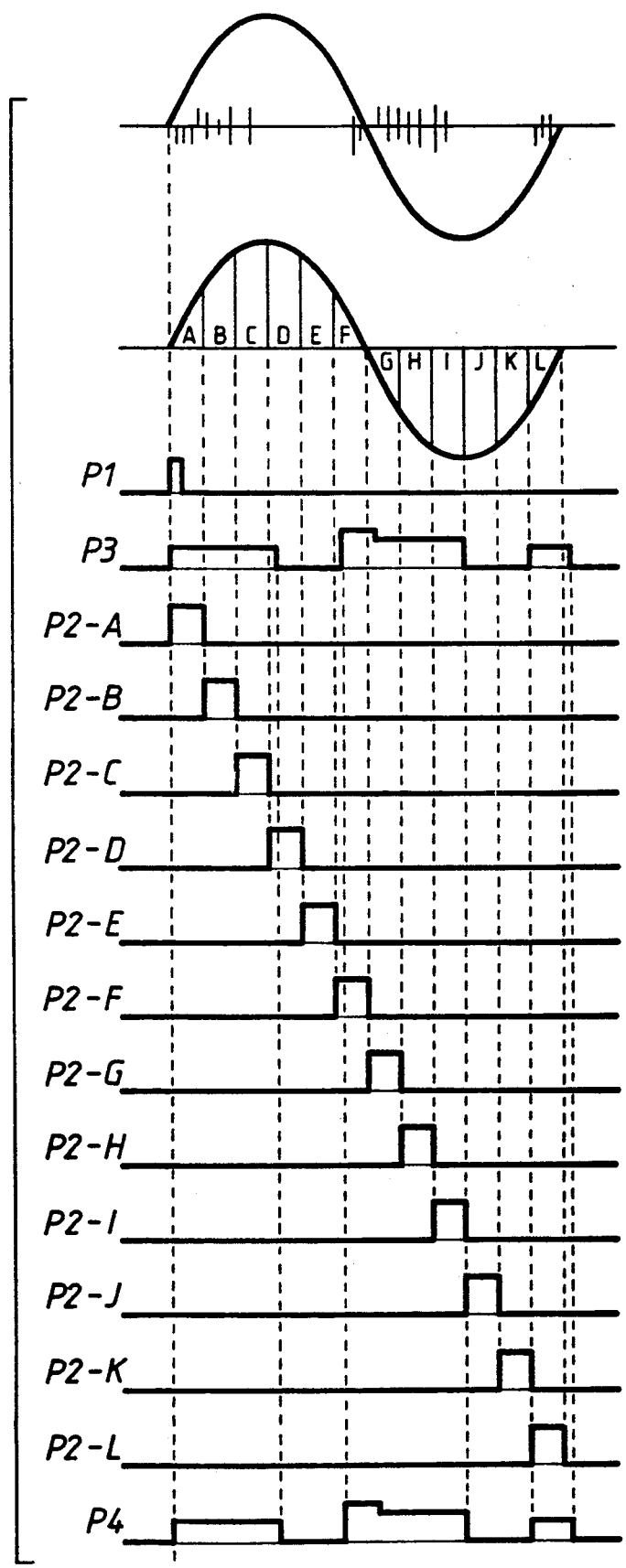
Fig. 4J. REASON 4 (CONTINUING)

SYSTEM AND METHOD FOR DETECTING PARTIAL DISCHARGE OF GAS-INSULATED SWITCHGEAR

BACKGROUND OF THE INVENTION

1. Field of the Invention:

The present invention relates to a partial discharge detecting system of a gas-insulated switchgear that detects partial discharge generated in the interior of a gas-insulated switchgear used in a substation etc.

2. Discussion of the Background:

In recent years, what are known as gas-insulated switchgears have become common, wherein a disconnector or circuit breaker, etc. is accommodated in a sealed enclosure filled with $SF_6$ gas, which has excellent insulating and arc-extinguishing properties. Such switchgears offer the advantages of small size and high performance.

A vital part of such a gas-insulated switchgear is the means used to detect abnormality occurring in the sealed enclosure. One such detecting means is a partial discharge detecting system that detects partial discharge occurring in the interior of the gas-insulated switchgear.

FIG. 1 shows an example of such a conventional partial discharge detecting system. A metal enclosure 1 of a gas-insulated switchgear 12 is grounded to earth and filled with the insulating gas $SF_6$. The enclosure is electrically divided by a bell-shaped insulation spacer 2 and coupled in the longitudinal direction.

Metal enclosure 1 accommodates a disconnector or circuit breaker constituting the gas-insulated switchgear. FIG. 1 shows part of the region where a conductor 3 supported by insulation spacer 2 is accommodated. This conductor 3 connects the transformer with the disconnector or circuit breaker.

A ring-shaped electrode 4 for checking the voltage is arranged in insulation spacer 2. A floating capacitance $C_1$ is therefore present between conductor 3 and electrode 4 and a floating capacitance $C_2$ is present between metal enclosure 1 and electrode 4.

A partial discharge detector 7 is provided with a filter 8, connected to electrode 4 and metal enclosure 1 by means of leads 5 and 6, that inputs the signals obtained through leads 5 and 6 and extracts the frequency of the partial discharge, an amplifier circuit 9 that amplifies the output signal of this filter 8, and a peak detector circuit 10 that detects the peak value of the output signal of this amplifier circuit 9.

Now, in a condition in which voltage is applied to conductor 3, floating capacitances $C_1$ and $C_2$ constitute a voltage-dividing circuit, so a dividing voltage is generated at the two terminals of floating capacitance $C_2$. A high-frequency component created by the partial discharge in metal enclosure 1 is superimposed on this dividing voltage.

The high-frequency component contained in the dividing voltage is therefore extracted by filter 8 of partial discharge detector 7, and its peak value is detected by peak detector circuit 10 through amplifier circuit 9. This detected peak value is output to a measurement device 11. One can thereby ascertain, using this measurement device 11, whether partial discharge has occurred within metal enclosure 1, based on the presence and magnitude of the input signal.

FIG. 2 shows the causes of partial discharge generated in metal enclosure 1 and the pattern of the resulting partial discharge pulse. Reason for partial discharge (1) may be further subdivided into case (1 - 1), in which discharge is produced due to the presence of bubbles or vacancies in the insulator in metal enclosure 1, and case (1-2), in which discharge is produced due to the formation of a gap at the surface of contact of the insulator and conductor.

In reason for partial discharge (2), discharge is produced when part of the insulator projects into the region in metal enclosure 1 that is filled with insulating gas (sharp edge). In reason for partial discharge (3), discharge is produced when part of the metal projects into the region in metal enclosure 1 that is filled with insulating gas (loose metal particles). In reason for partial discharge (4), discharge is produced when there is poor contact at locations where one conductor is in contact with another conductor in metal enclosure 1.

As can be seen from the figure, these reasons for partial discharge (1) to (4) result in discharge pulses having different patterns. The pattern of the discharge pulse is also different, depending on whether discharge has just started (left-hand column labeled "STARTING") or whether a stable condition of continuing discharge has been produced (right-hand column labeled "CONTINUING"). The sine wave waveform in the figure is the fundamental wave component, i.e., the 50 Hz mains frequency component of the voltage that is applied to conductor 3 while the small vertical lines at the zero axis represent the noise introduced into the sine wave waveform due to the partial discharge pulse. It can be seen that there are different phase differences between the discharge pulse and the fundamental wave component of the voltage, depending on the type of abnormality that gives rise to the partial discharge.

However, in the case of the conventional partial discharge detector, only the magnitude of the partial discharge pulse is detected and the phase difference with the fundamental wave component of the voltage is not detected, so the cause of the occurrence of partial discharge cannot be detected. Also, even the signal detected as the partial discharge pulse may consist of random noise superimposed on the fundamental wave of the voltage, so in determining whether partial discharge is taking place or not, a large range of error has to be taken into account. This therefore gives rise to a problem of loss of measurement accuracy.

A technique which has recently been employed is to convert the detected partial discharge pulse into an optical signal, which is then transmitted to a monitoring room. However, in the conventional partial discharge detector, this point was not taken into consideration.

SUMMARY OF THE INVENTION

It is therefore an object of this invention is to provide a novel system and method for detecting partial discharge of gas-insulated switchgear wherein the accuracy of detection of partial discharge is improved and wherein it is possible to distinguish not only the presence of partial discharge but also the cause of its occurrence.

A further object of this invention is to provide a system and method for detecting partial discharge of gas-insulated switchgear wherein the signal corresponding to partial discharge can be detected accurately without being affected by external noise.

These and other objects of the invention can be achieved by the system and the method described below.

A first embodiment of the system for detecting partial discharge of generated in an interior of a gas-insulated switchgear used in a transformer installation includes high-frequency detection means for detecting a high-frequency component of a voltage applied to the gas-insulated switchgear, fundamental wave detection means for detecting the fundamental wave component of the voltage applied to the gas-insulated switchgear, voltage starting-point setting means for detecting a zero-crossing point of the fundamental wave component obtained by the fundamental wave detection means, and setting a starting point based upon the zero-crossing point, detected signal processing means for performing signal processing on a first output signal of the high-frequency detection means and a second output signal of the voltage starting-point setting means, and outputting respective first and second optical signals corresponding to the first and second output signals, and partial discharge decision means for converting the first and second optical signals from the detected signal processing means into respective first and second pulse signals and ascertaining presence of partial discharge and a reason for the presence of partial discharge, based on the first and second pulse signals. The first embodiment produces the first pulse signal representing the high-frequency component of the fundamental wave and can determine the presence of and reason for the partial discharge as the positions of the partial discharge pulses relative to the fundamental wave depend on the cause of the partial discharge.

A second embodiment of the system for detecting partial discharge generated in the interior of a gas-insulated switchgear used in a transformer installation includes first high-frequency detection means, provided at a bushing of the gas-insulated switchgear, for detecting a first high-frequency component superimposed on the voltage applied to the conductor of said gas-insulated switchgear, caused by external noise entering the gas-insulated switchgear, second high-frequency detection means, provided at a central location of the gas-insulated switchgear, for detecting a second high-frequency component superimposed on the voltage applied to the conductor of said gas-insulated switchgear, caused by partial discharge in said interior of the gas-insulated switchgear, fundamental wave detection means for detecting a fundamental wave component of the voltage applied to the conductor of gas-insulated switchgear, voltage starting-point setting means for detecting a zero-crossing point of the fundamental wave component obtained by the fundamental wave detection means, and setting a starting point based upon for said zero-crossing point, detected signal processing means for performing signal processing on a first output signal of the first high-frequency detection means, a second output signal of the second high-frequency detection means, and a third output signal of said voltage starting-point setting means, and outputting respective first, second and third optical signals corresponding to the first, second and third output signals, and partial discharge decision means for converting the first, second and third optical signals from the detected signal processing means into respective first, second and third pulse signals and ascertaining a presence of partial discharge and a reason for said presence of partial discharge, based on a relationship between the first, second and third pulse signal. In the second embodiment, the effect of noise on the determination of the occurrence and the reason for the occurrence is reduced, as the relationship between noise entering in the system and the partial discharge pulses is taken into consideration in by the decision means.

A first embodiment of the method for detecting partial discharge generated in an interior of a gas-insulated switchgear used in a transformer installation includes the steps of detecting a high-frequency component of a voltage applied to a conductor of the gas-insulated switchgear, detecting a fundamental wave component of the voltage applied to the conductor of the gas-insulated switchgear, determining whether the partial discharge has occurred, and a reason for the partial discharge, based upon a relationship between the high-frequency component of and the fundamental wave component of the voltage applied to the conductor of the gas-insulated switchgear.

A second embodiment of the method for detecting partial discharge generated in an interior of a gas-insulated switchgear used in a transformer installation includes the steps of detecting a first high-frequency component of a voltage applied to a conductor of said gas-insulated switchgear due to noise superimposed on said voltage, detecting a second high-frequency component of the voltage applied to the conductor of the gas-insulated switchgear due to the partial discharge in the interior of the gas-insulated switchgear, detecting a fundamental wave component of the voltage applied to the conductor of the gas-insulated switchgear, determining whether the partial discharge has occurred, and a reason for the partial discharge, based upon a relationship between the first and second high-frequency components and the fundamental wave component of the voltage applied to said conductor of said gas-insulated switchgear.

The embodiments of the method according to the invention, by detecting both a fundamental wave component and a high-frequency component of the voltage applied to the switchgear, can determine both that partial discharge has occurred, and a reason for the discharge using a relationship between the fundamental wave component and a high-frequency component.

BRIEF DESCRIPTION OF THE DRAWINGS

A more complete appreciation of the invention and many of the attendant advantages thereof will be readily obtained as the same becomes better understood be reference to the following detailed description when considered in connection with the accompanying drawings, wherein:

FIGS. 4A-4J are diagrams given in explanation of the operation of the first embodiment shown in FIG. 3;

DESCRIPTION OF THE PREFERRED EMBODIMENTS

Figure 1:
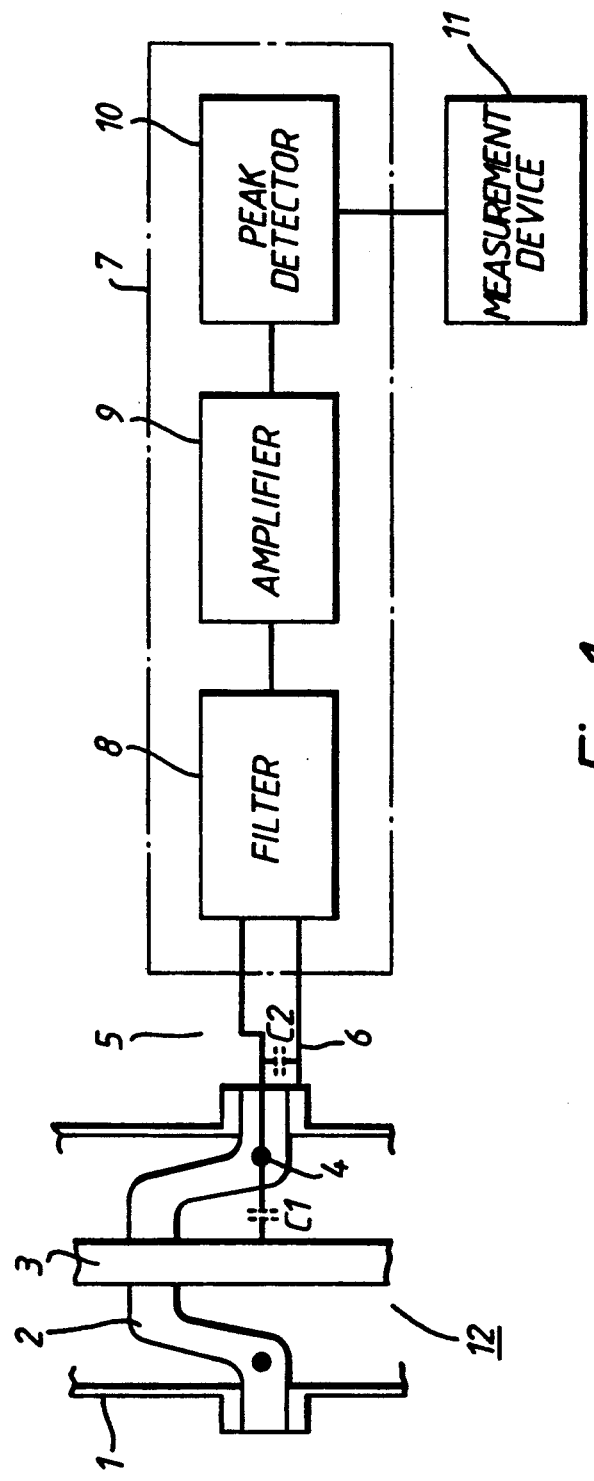
FIG. 1 is a block diagram showing a conventional partial discharge detecting system of a gas-insulated switchgear.
Figure 3:
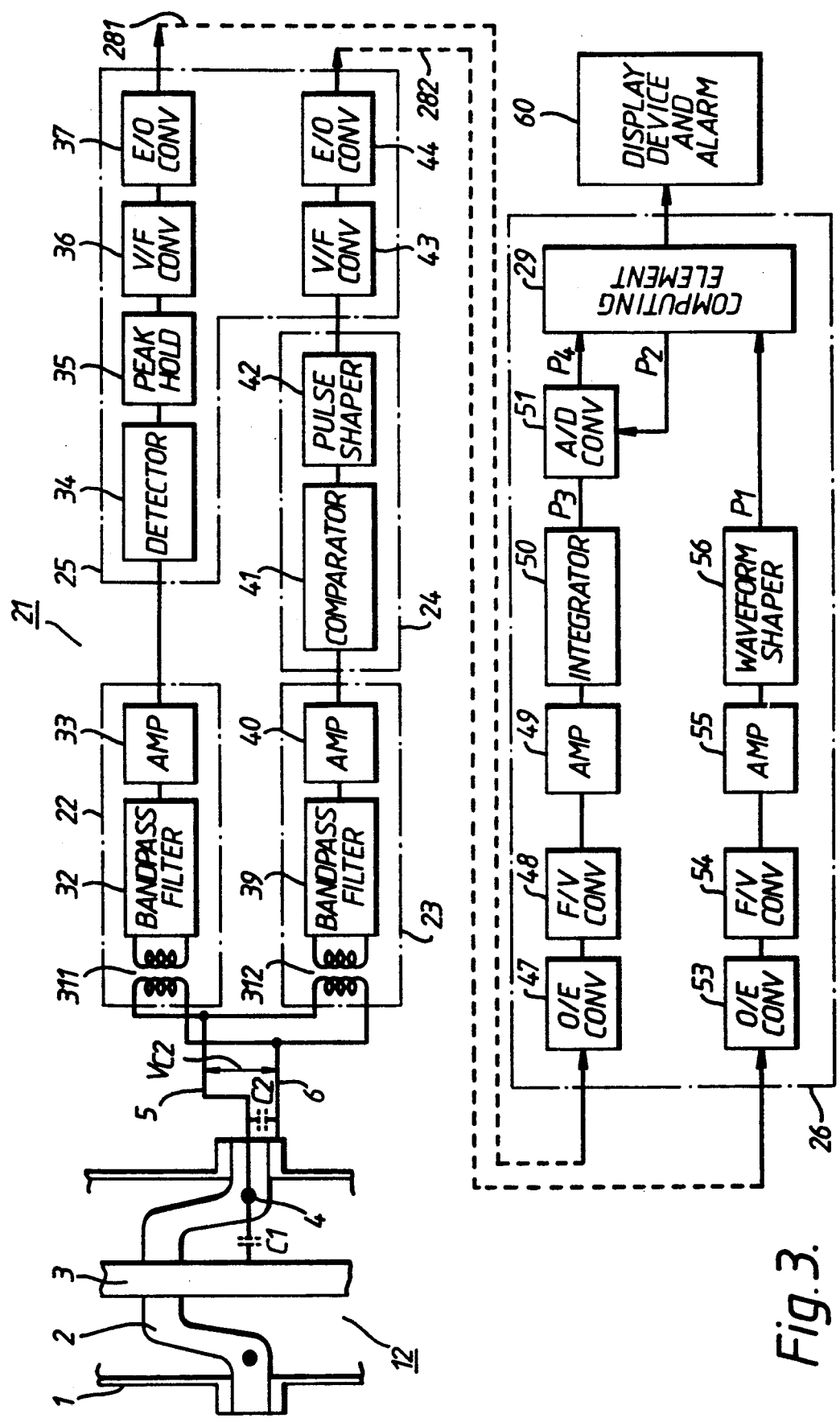
FIG. 3 is a block layout diagram showing a first embodiment of the system according to the invention.

Referring now to the drawings, wherein like reference numerals designate identical or corresponding parts throughout the several views, and more particularly to FIG. 3 thereof, which shows a first embodiment of a partial discharge detecting system of a gas-insulated switchgear according to this invention. Gas-insulated switchgear 12 is the same as that shown in FIG. 1. In the condition in which voltage is applied to conductor 3, a voltage division circuit for the applied voltage is formed by floating capacitances $C_1$ and $C_2$. The high-frequency component created by partial discharge occurring within metal enclosure 1 is superimposed on this dividing voltage.

High-frequency detecting device 22 of partial discharge detecting system 21 detects the high-frequency component contained in dividing voltage $V_{C2}$ between heads 5 and 6. It comprises a transformer 311 that transforms dividing voltage $V_{C2}$, a band-pass filter 32 that extracts the high-frequency component caused by partial discharge in the output signal of transformer 311, and an amplifier 33 that amplifies the output signal of band-pass filter 32.

Also provided is a fundamental wave detecting device 23 which detects the fundamental wave component of dividing voltage $V_{C2}$ i.e., the mains frequency component. It comprises a transformer 312 that transforms dividing voltage $V_{C2}$, a band-pass filter 39 that extracts the fundamental wave component of the output signal of transformer 312, and an amplifier 40 that amplifies the output signal of band-pass filter 39.

The fundamental wave component of dividing voltage $V_{C2}$ extracted by fundamental wave detecting means 23 is input to a setting device 24 of the starting point for the voltage. Voltage starting point setting device 24 detects the zero-crossing point of the fundamental wave component of dividing voltage $V_{C2}$ and outputs this as the starting point for the voltage, in the form of a pulse signal. This voltage starting point setting device 24 consists of a comparator 41 that detects the zero-crossing point of the output signal of fundamental wave detecting device 23 and outputs a pulse signal, and a pulse shaping circuit 42 that shapes the waveform of the pulse signal of comparator 41. The output signal of high-frequency detecting device 22 and the output signal of voltage starting point setting device 24 are input to a detected signal processing device 25.

Detected signal processing device 25 carries out signal processing on the high-frequency component contained in dividing voltage $V_{C2}$ detected by high-frequency detecting device 22 and on the pulse signal indicating the starting point for the voltage which is obtained by voltage starting point setting device 24 to produce a signal that is suitable for optical transmission to a partial discharge ascertaining device 26.

The high-frequency component contained in dividing voltage $V_{C2}$ detected by high-frequency detecting device 22 is detected by a detector circuit 34 of detected signal processing device 25 and the output signal of detector circuit 34 is converted to a fixed pulse width by a peak hold circuit 35. The output signal of peak hold circuit 34 is then frequency-modulated by a V/F converter circuit. This frequency-modulated signal is then converted to an optical signal by an E/0 converter 37 and input to partial discharge ascertaining device 26 through an optical fiber 281.

The pulse signal from voltage starting point setting device 24 indicating the starting point for the voltage is input to a V/F converter 43 of detected signal processing device 25, where it is frequency-modulated. This frequency-modulated signal is then converted to an optical signal by an E/0 converter 44, and input to partial discharge ascertaining device 26 through an optical fiber 282.

Partial discharge ascertaining device 26 converts the optical signals that are input through optical fibers 281 and 282 into pulse signals $P_3$ and $P_1$, respectively, (see FIG. 4). Based on pulse signal $P_3$ indicating the magnitude of the high-frequency component of dividing voltage $V_{C2}$ and pulse signal $P_1$ indicating the starting point for the voltage of dividing voltage $V_{C2}$, partial discharge ascertaining device 26 ascertains whether partial discharge is taking place, and the reason or reasons for the occurrence of such partial discharge.

The optical signal indicating the magnitude of the high-frequency component of the dividing voltage $V_{C2}$ that is input from detected signal processing device 25 is converted to pulse signal $P_3$ indicating the magnitude of the high-frequency component of dividing voltage $V_{C2}$ by means of an O/E converter 47, F/V converter 48, amplifier 49, and integrating circuit 50. The optical signal indicating the starting point for the voltage of dividing voltage $V_{C2}$ that is input from detected signal processing device 25 is converted to pulse signal $P_1$ indicating the starting point for the voltage of dividing voltage $V_{C2}$ by means of an O/E converter 53, F/V converter 54, amplifier 55, and waveform shaping circuit 56.

Pulse signal $P_1$ indicating the starting point for the voltage is input to a computing element 29. Computing element 29 can be implemented using a CPU, a microprocessor or a computer, for example. Based on this pulse signal $P_1$, computing element 29 outputs an instrumentation timing pulse signal $P_2$ to an A/D converter 51. A/D converter 51 introduces the pulse signal $P_4$ indicating the high frequency component into computing element 29 only during the period when instrumentation timing pulse signal $P_2$ is being input.

FIGS. 4A–4J are diagrams given in explanation of the operation of partial discharge detecting system partial discharge detecting system 21 of this invention. Now, fundamental wave component $V_0$ of dividing voltage $V_{C2}$ contains a high frequency component $V_1$. High frequency component $V_1$ contained in dividing voltage $V_{C2}$ is detected by high-frequency detecting device 22 and the detected high frequency component $V_1$ is subjected to signal processing by detected signal processing device 25 to produce an optical signal which is optically transmitted to partial discharge ascertaining device 26.

Fundamental wave component $V_0$ of dividing voltage $V_{C2}$ is detected by fundamental wave detecting device 23. Voltage starting point setting device 24 then converts the zero-crossing point of fundamental wave component $V_0$ into a pulse signal constituting the starting point for the voltage. This is then subjected to signal processing by detected signal processing device 25 to produce an optical signal which is optically transmitted to partial discharge ascertaining device 26. Partial discharge ascertaining device 26 finds the high frequency component $V_1$ of dividing voltage $V_{C2}$ as pulse signal $P_3$ and fundamental wave component $V_0$ of dividing voltage $V_{C2}$ as pulse signal $P_1$.

Figure 2:
FIGS. 2 is a diagram given in explanation of the patterns generated by partial discharge pulses with respect to the fundamental wave component of the voltage applied to a gas-insulated switchgear.

Computing element 29 of detected signal processing means 25 outputs instrumentation timing pulse signal $P_2$ to A/D converter 51 based on pulse signal $P_1$ indicating the starting point for the voltage. Instrumentation timing pulse signal $P_2$ that is output by computing element 29 is a command signal, with reference to the starting point for the voltage, for introduction of pulse signal $P_4$ indicating the magnitude of the high-frequency component to computing element 29. It is to be noted that signal $P_4$ is a digital signal to be input to computing element 29 in a form element 29 is able to process. Thus, the signal $P_4$ in FIGS. 4A–4J is shown for convenience of explanation and does not represent the actual shape of the signal sent to element 29. The reason for partial discharge as indicated in FIG. 2 can therefore be determined.

Figure 4A:
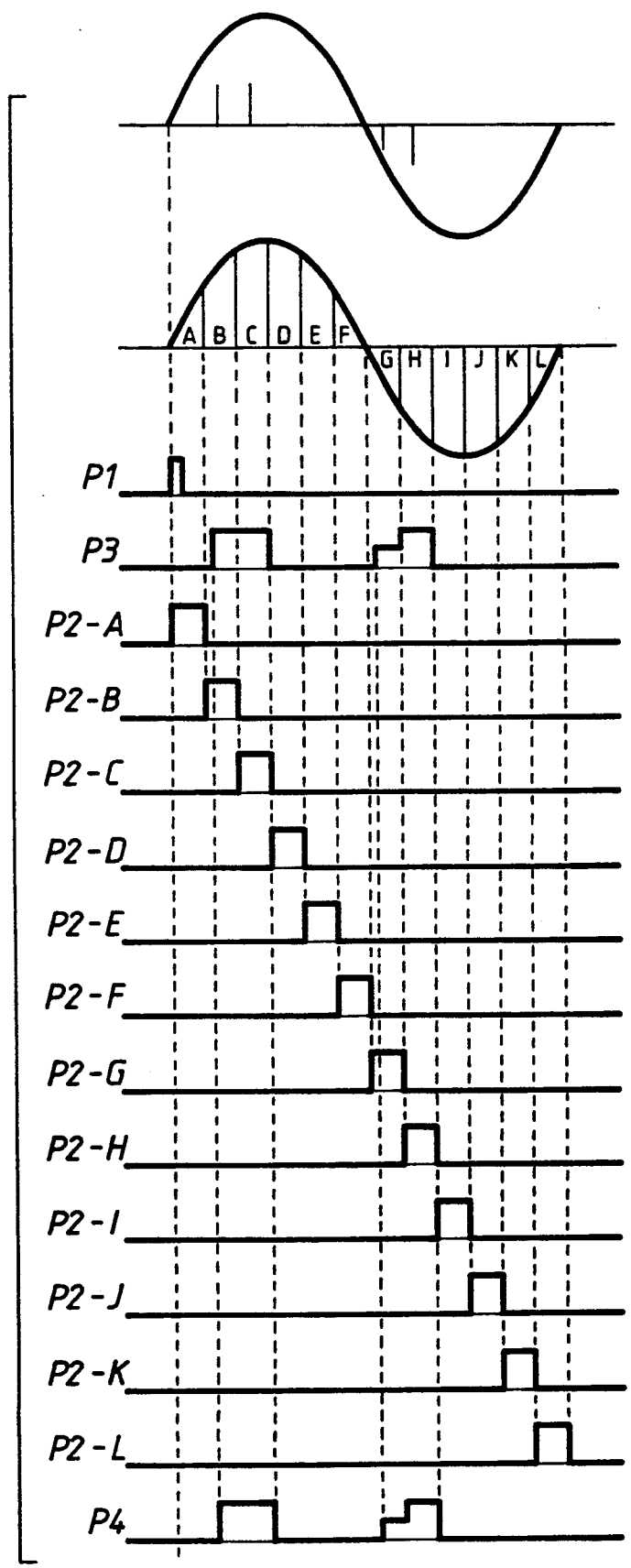
Figure 4B:
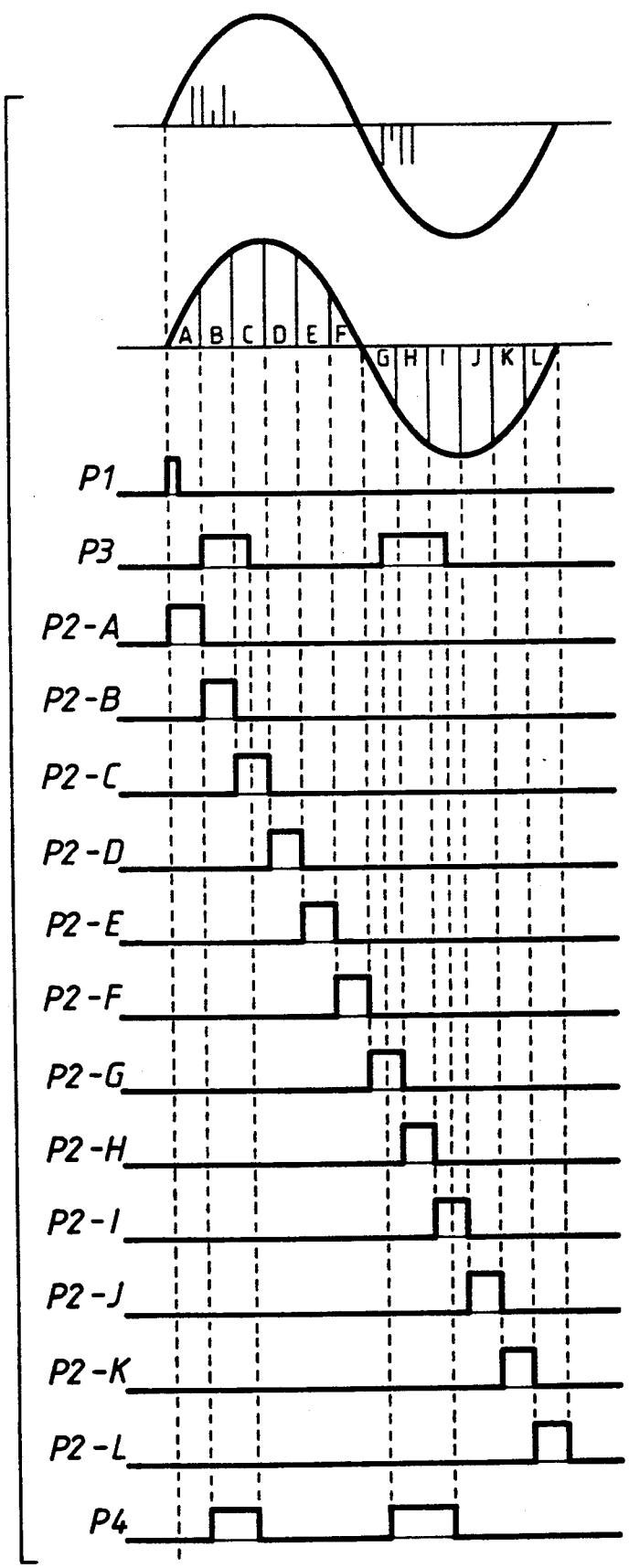
Figure 4D:
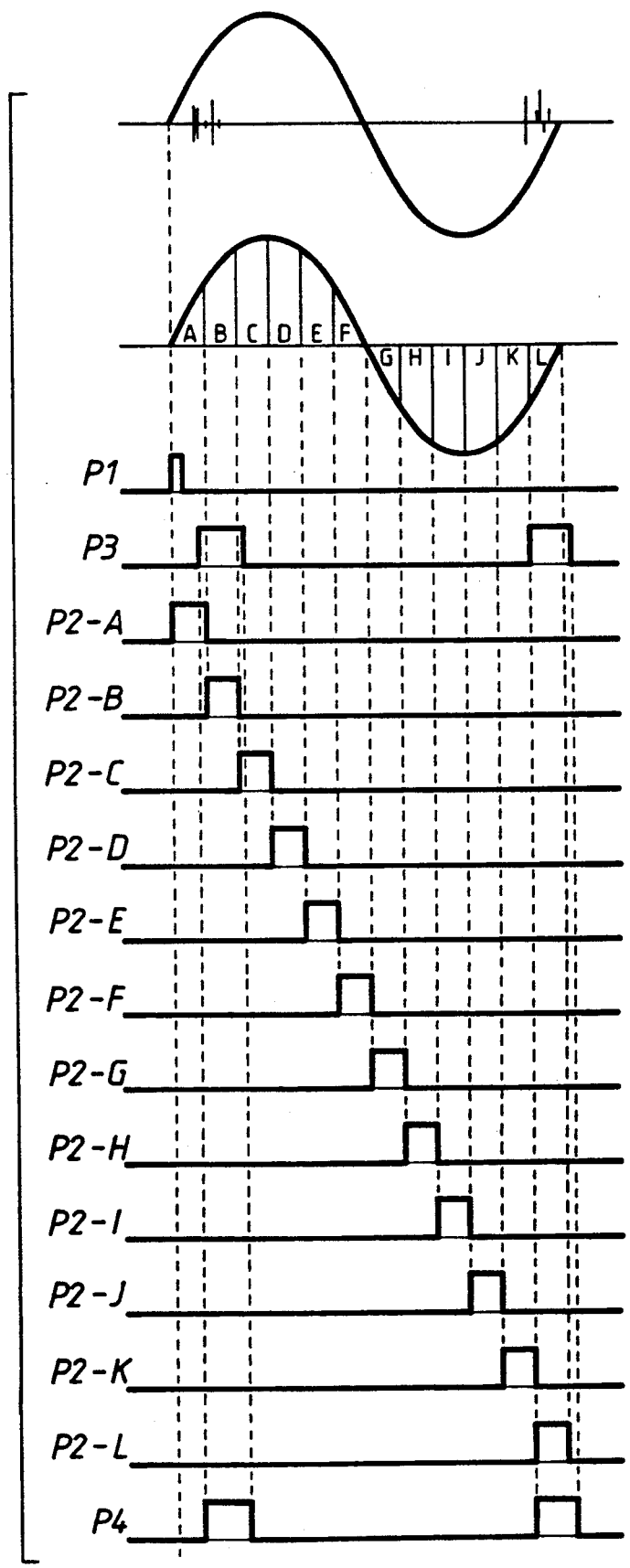
Figure 4E:
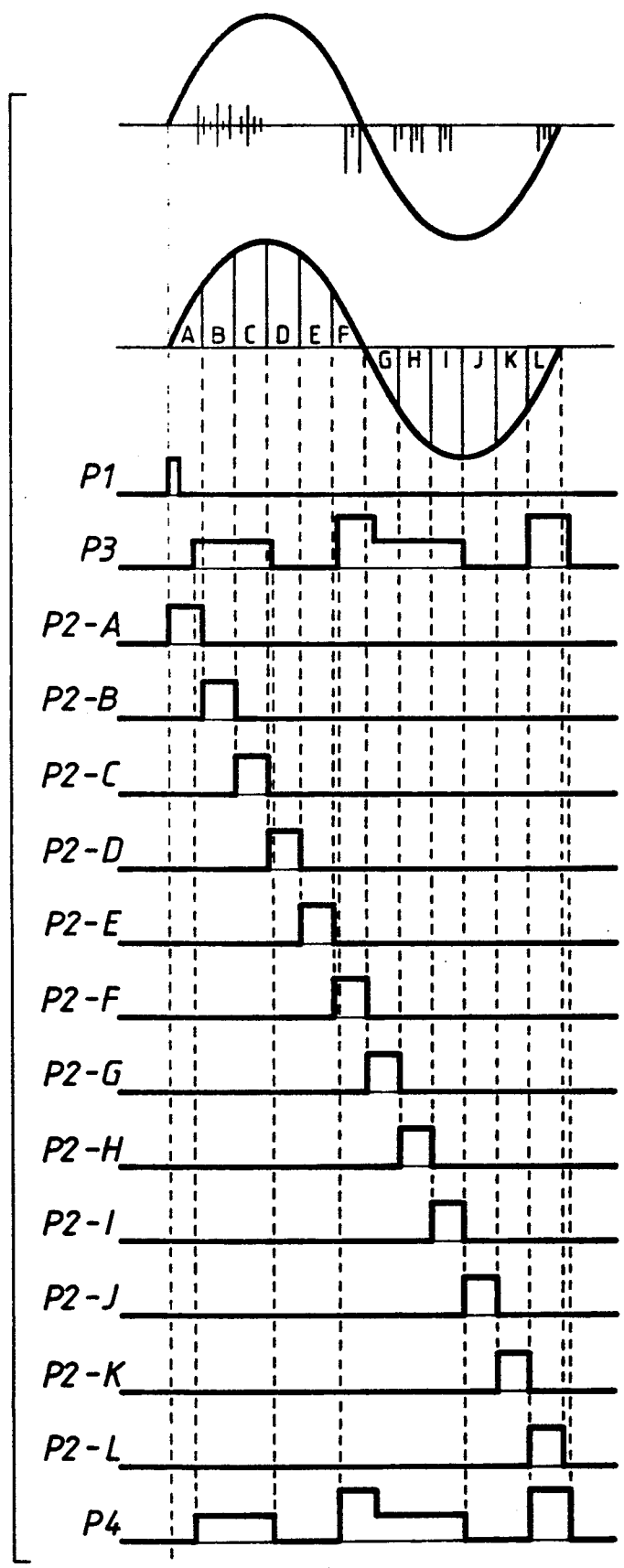
Figure 4G:
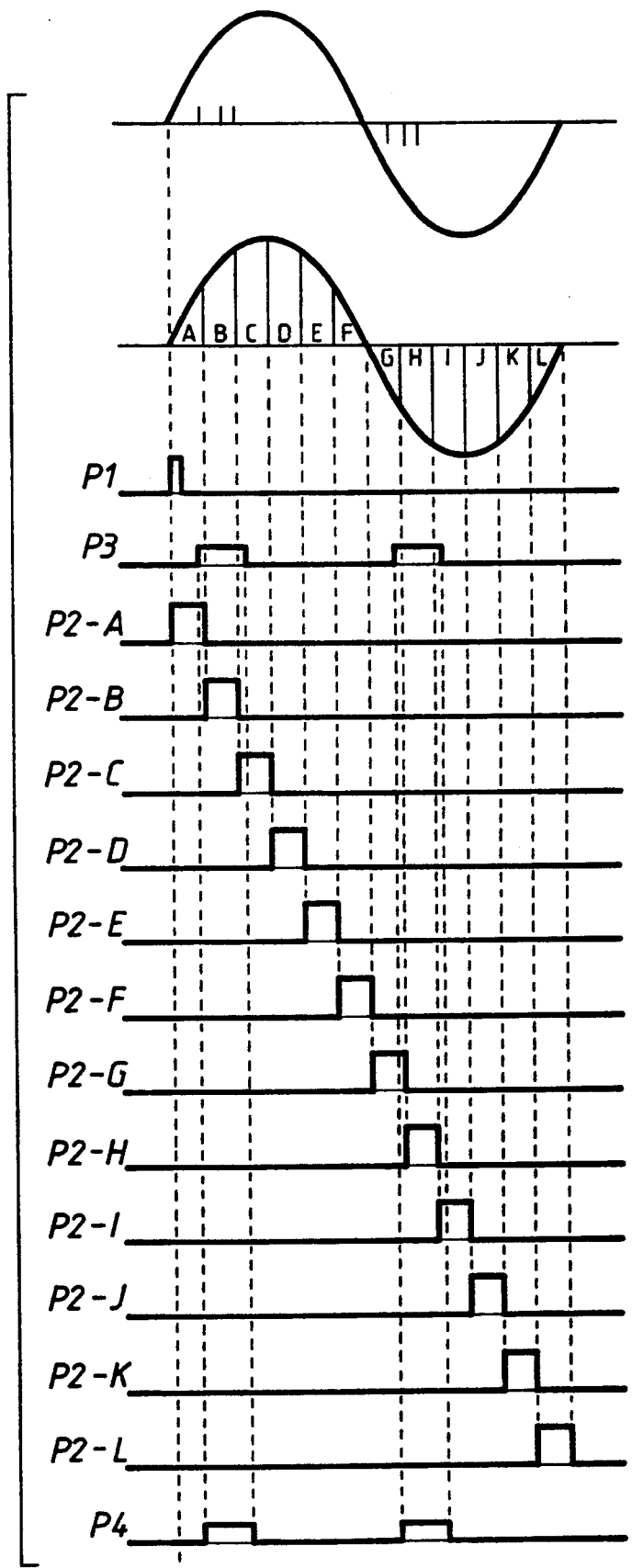
Figure 4I:
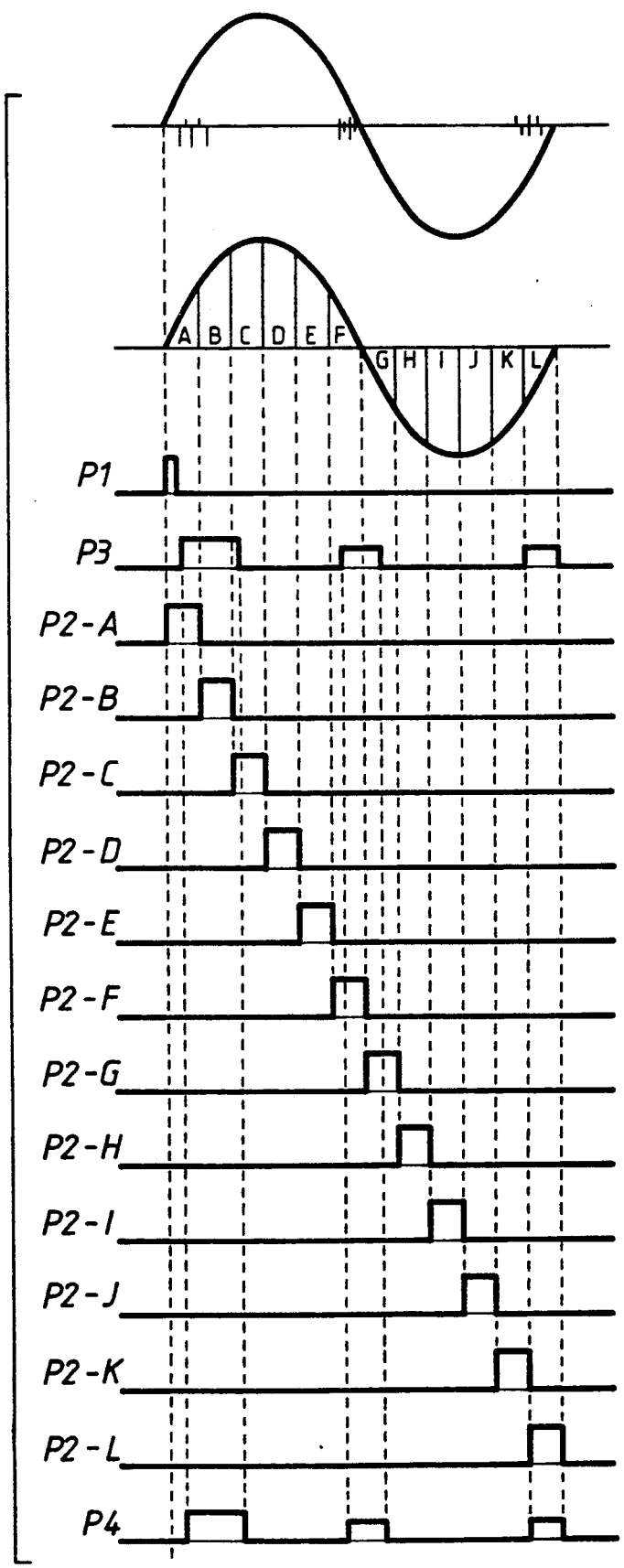

A first example of the operation of the first embodiment will be described in relation to FIG. 4A. Based upon pulse signal $P_1$ indicating the starting point for the measuring cycle output from waveform shaping circuit 56, computing element 29 outputs timing pulse signal $P_2$ which is a series of pulses $P_2$-A to $P_2$-L successively during the measurement time cycle period. While timing pulse signal $P_2$ is shown as consisting of twelve pulses $P_2$-A to $P_2$-L, it is understand that this is given by way of example only and the actual number of pulses can be varied based upon the requirements of the partial discharge detecting system and the gas-insulated switchgear. FIG. 4A corresponds to a partial discharge due to a vacancy or bubble corresponding to reason 1-1 in the starting discharge condition as shown in FIG. 2. The signals $P_{2-A}$ to $P_{2-L}$ are received by A/D converter 51 converts the partial discharge pulse $P_3$ to a digital signal which is input to computing element 29. Computing element 29 receives the digital signal $P_4$ from A/D converter 51 and stores signal $P_4$ in a memory section thereof. Computing element 29 then compares the stored signal $P_4$ with other patterns stored beforehand and determines whether a partial discharge has occurred based upon the signal $P_4$. If it is determined that a partial discharge has occurred, that is, the signal $P_4$ corresponds to one of the known reasons for partial discharge, such as shown in FIG. 2, computing element 29 outputs a signal to an external display device and alarm 60 which displays the results of the partial discharge determination and produces an alarm. As is apparent from FIG. 4A, the signal $P_4$ provides both pulse magnitude and pulse phase information relative to the fundamental wave which allows the determination of whether a partial discharge has occurred.

Similarly, FIGS. 4B–4J illustrate the determination of partial discharges corresponding to reasons 1-2, 2, 3 and 4 of the starting discharge condition and to reasons 1-1, 1-2, 2, 3 and 4 of the continuing discharge condition, respectively. As the operation of computing element 29 is the same in each case, a detailed explanation of each Figure will be omitted for brevity.

Figure 5:
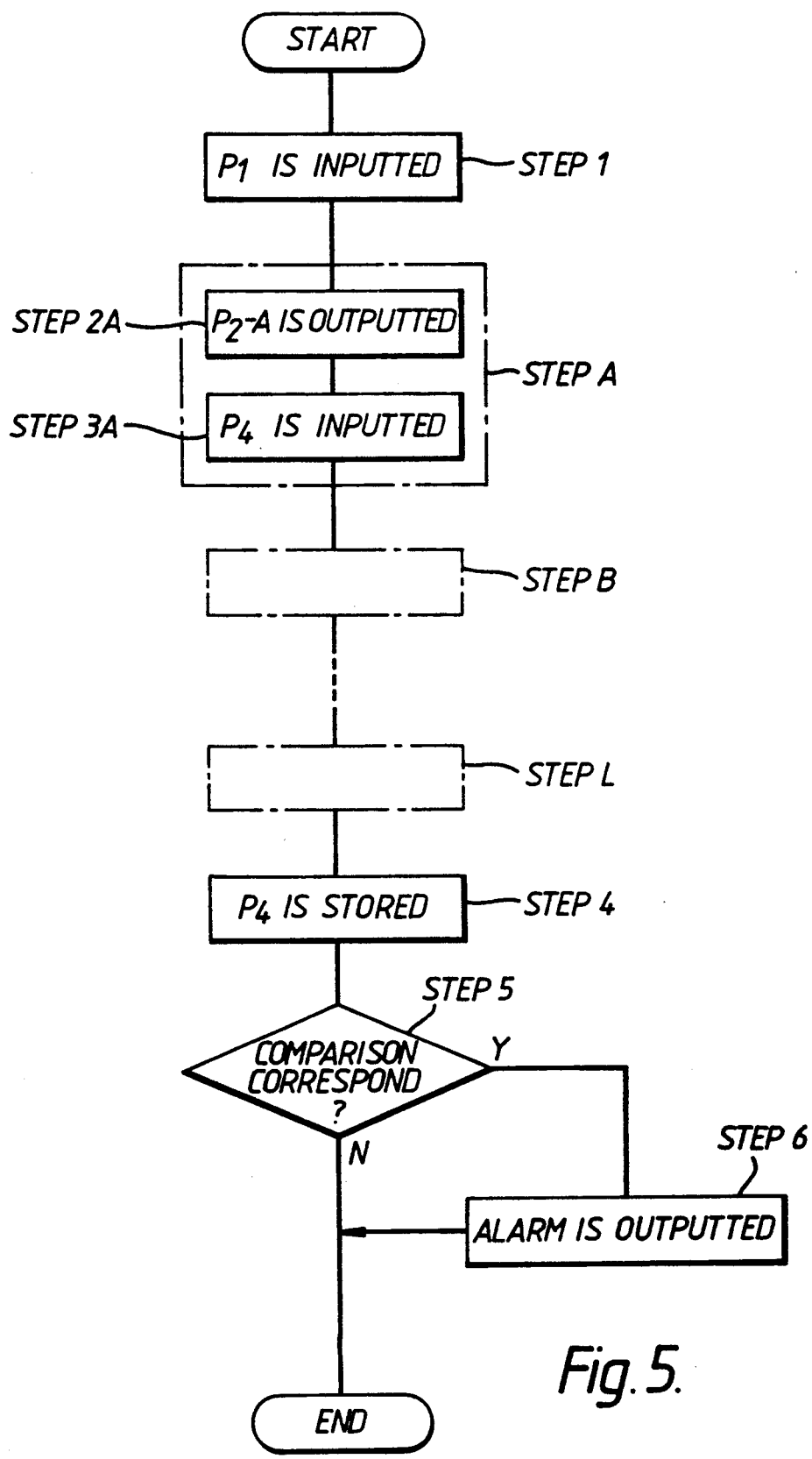
FIG. 5 is a flow chart of the operation of the first embodiment according to the invention.

FIG. 5 is flow diagram given an explanation of the operation of the first embodiment shown in FIG. 3. In step 1, pulse signal $P_1$ is inputted to computing element 29, which triggers the output of timing pulse signal $P_2$. In step A which consists of steps 2A and 3A, pulse $P_2$-A is outputted to A/D converter 51 and the portion of pulse signal $P_4$ occurring during the duration of pulse $P_2$-A is inputted to computing element 29. The same procedure as in step A is repeated in steps B-L such that all of the pulses of timing pulse signal $P_2$ are output to A/D converter 51 which converts pulse signal $P_3$ into digital signal $P_4$, and the corresponding portions of digital signal $P_4$ are input to computing element 29. In step 4, signal $P_4$ is stored in a memory section of computing element 29. Computing element 29 compares the stored digital signal $P_4$ with other stored known patterns which correspond to the partial discharge pattern shown in FIG. 2 (step 5). If the digital signal $P_4$ corresponds to one of the patterns, an alarm signal is generated and recorded in step 6. If the digital signal $P_4$ does not correspond to one of the partial discharge patterns, then the measurement cycle ends.

The following advantages are thereby obtained. First, the signal of specific frequency corresponding to partial discharge that is isolated by band-pass filter 32 often contains noise, which gives rise to measurement error. This noise cannot be removed by the conventional method of simply converting to a fixed pulse signal using a peak hold circuit or the like. However, in the first embodiment according to the invention, only pulse signals $P_3$ of specific frequency that are generated while instrumentation timing pulse signal $P_2$ is being output are subjected to A/D conversion and measured. Such a pulse of specified frequency is therefore present at a phase position, with respect to the phase of the main circuit voltage, at which partial discharge pulses are most likely to be generated, i.e., a phase position at which such a pulse is unlikely to be the result of noise. Another way of expressing this is that pulse signals which have a high probability of being due to noise are screened out, so that such noise scarcely affects measurement. As a result, the probability that such a specified frequency pulse is a pulse signal caused by partial discharge is very high. Thus the accuracy of measurement possible with the first embodiment according to the invention is greatly increased in comparison with the conventional device, in which the decision whether a partial discharge pulse has been generated is simply made on the basis of the presence or absence of a pulse of the specified frequency.

Also, since it is known that, as shown in FIG. 2, the positions at which partial discharge pulses are generated relative to the phase of dividing voltage $V_{C2}$ depend on the cause of the partial discharge, by changing the instrumentation starting time and instrumentation time width of the pulses of timing pulse $P_2$ as required, timing pulse $P_2$ can be output in the range where it is anticipated that partial discharge may occur. Thus, the cause of partial discharge can be ascertained from the pattern of occurrence by measuring whether there are any pulses of specified frequency in this range.

A pulse resolution of about 1/100 of the period of the mains frequency is sufficient in order to measure partial discharge pulses in relation to the phase of the mains frequency voltage. Accordingly, in the first embodiment, the partial discharge pulses are subjected to peak-holding or integration within a time width on this order, forming pulse signals for optical transmission. These formed pulse signals are then V/F converted, then E/0 converted, and transmitted optically to partial discharge ascertaining device 26 in a signal condition close to a digital signal. It is thereby possible to eliminate the effect of attenuation due to the length of the optical fiber cable or the effect of fluctuation in the amount of such attenuation due to the optical connector units. The time required for in situ adjustment of individual sensors can thereby be reduced, and unstable measurement conditions resulting from the amount of attenuation changing every time an optical connector is added or removed can be greatly reduced.

Figure 6:
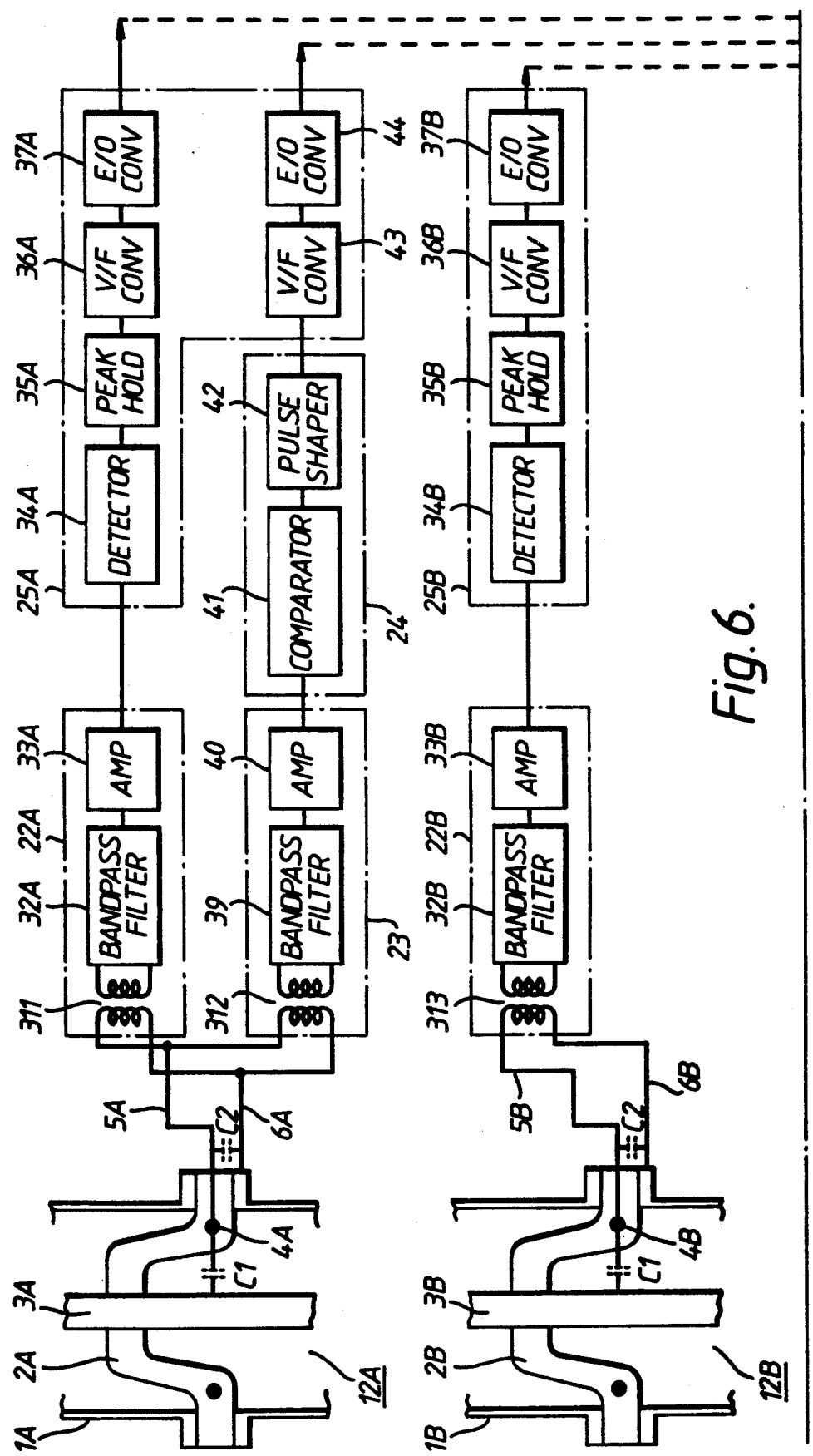
FIG. 6 is a block layout diagram showing a second embodiment of the system according to the invention.
Figure 6:
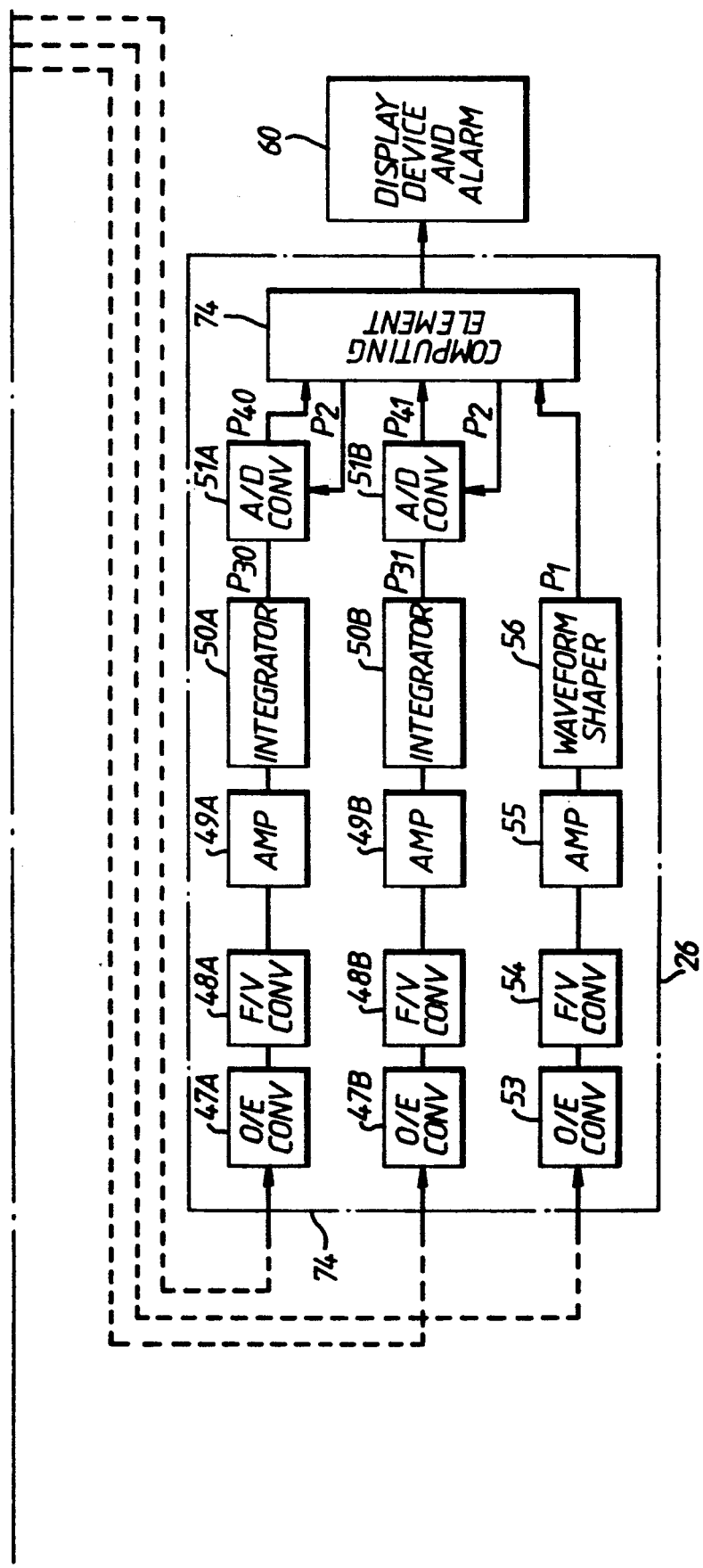

FIG. 6 is a block diagram showing a second embodiment of the invention. This embodiment represents a further improvement over the first embodiment shown in FIG. 3. In the first embodiment, errors can still be caused by external noise present having a frequency that is being measured entering gas-insulated switchgear 21 while instrumentation timing pulse signal $P_2$ is being output. Although the ingress of such external noise is infrequent and sporadic, it does present an obstacle to raising accuracy. The second embodiment is adapted to eliminate causes of error due to such external noise.

The frequency of partial discharge pulses occurring in gas-insulated switchgears is generally some tens of MHz. In comparison, partial discharges caused by external noise entering the gas-insulated switchgear through parts such as the bushing of the gas-insulated switchgear are below some 100 KHz, sometimes overlaid with high-frequency components of some tens of MHz or more. Of such external noise, high-frequency components below some 100 KHz cannot be detected within the gas-insulated switchgear, and can only be detected in the vicinity of the bushing.

The reason for this is that frequency components below some 100 kHz in the external noise have wavelengths of 1000 m and upwards, and a gas-insulated switchgear of an extent of at most about 100 m only has a lumped-constant electrostatic capacitance characteristic. That is, this electrostatic capacitance is some 1000 to some 10000 pF for the gas-insulated switchgear as a whole, so noise of below some 100 kHz is absorbed in the electrostatic capacitance between the conductor and earth.

In contrast, for high-frequency components of partial discharge pulses of over some tens of MHz generated inside and outside the gas-insulated switchgear, the gas-insulated switchgear can be regarded as a distributed-constant circuit. Such high-frequency components are therefore propagated through the switchgear with little attenuation. Accordingly, in the second embodiment, arrangements are made whereby, if external noise enters the gas-insulated switchgear and a partial discharge is generated due to high-frequency components of some tens of MHz superimposed on this external noise, this can be identified as not representing partial discharge originating from a cause to be found within the gas-insulated switchgear itself. Respective high-frequency detection devices 22A and 22B ar provided that detect high-frequency components in two different locations within the same gas-insulated switchgear. While FIG. 5 shows two gas-insulated switchgears 12A and 12B, it is understood that switchgears 12A and 12B are provided for convenience of explanation only, and that switchgears 12A and 12B are two portions of a single gas-insulated switchgear 12 having two bushing parts 12A and 12B.

As shown in FIG. 6, first high-frequency detection device 22A is provided on bushing part 12A of gas-insulated switchgear 12 having a detection frequency set to under some 100 kHz. This can be used to decide whether any external noise has entered. Second high-frequency detection device 22B positioned in the middle of gas-insulated switchgear 12 having a detection frequency set to over some tens of MHz. This can be used to decide whether partial discharge has occurred within gas-insulated switchgear 12.

First detected signal processing device 25A that performs signal processing of the output signal of first high-frequency detection device 22A, fundamental wave detecting device 23, and voltage starting point setting device 24 are the same as in the first embodiment shown in FIG. 3. Second detected signal processing device 25B that performs signal processing of the output signal of second high-frequency detection device 22B is the same as first high-frequency detection device 25A except that it does not have units 43 and 44 that perform signal processing on the signal from voltage starting point setting device 24.

Also, partial discharge ascertaining device 26 is the same as that of FIG. 3 except that units 47B, 48B, 49B and 50B that perform signal processing on the signals obtained through second high-frequency detection device 22B and second detected signal processing device 25B are added to partial discharge ascertaining device 26 of FIG. 3.

First high-frequency detection device 22A detects external noise that is generated at bushings in the same bus or overhead line. In contrast, the detection frequency of second high-frequency detection device 22B is higher than that of first high-frequency detection device 22A, so, because of the difference in propagation characteristics described above, partial discharge pulses generated in the interior at central position 12B of gas-insulated switchgear 12 and high-frequency components superimposed on external noise are detected.

Finally, these detected signals are respectively subjected to signal processing as pulse signal $P_{30}$ indicating the external noise and pulse signal $P_{31}$ indicating partial discharge, and are input to A/D converters 51A and 51B.

Figure 7:
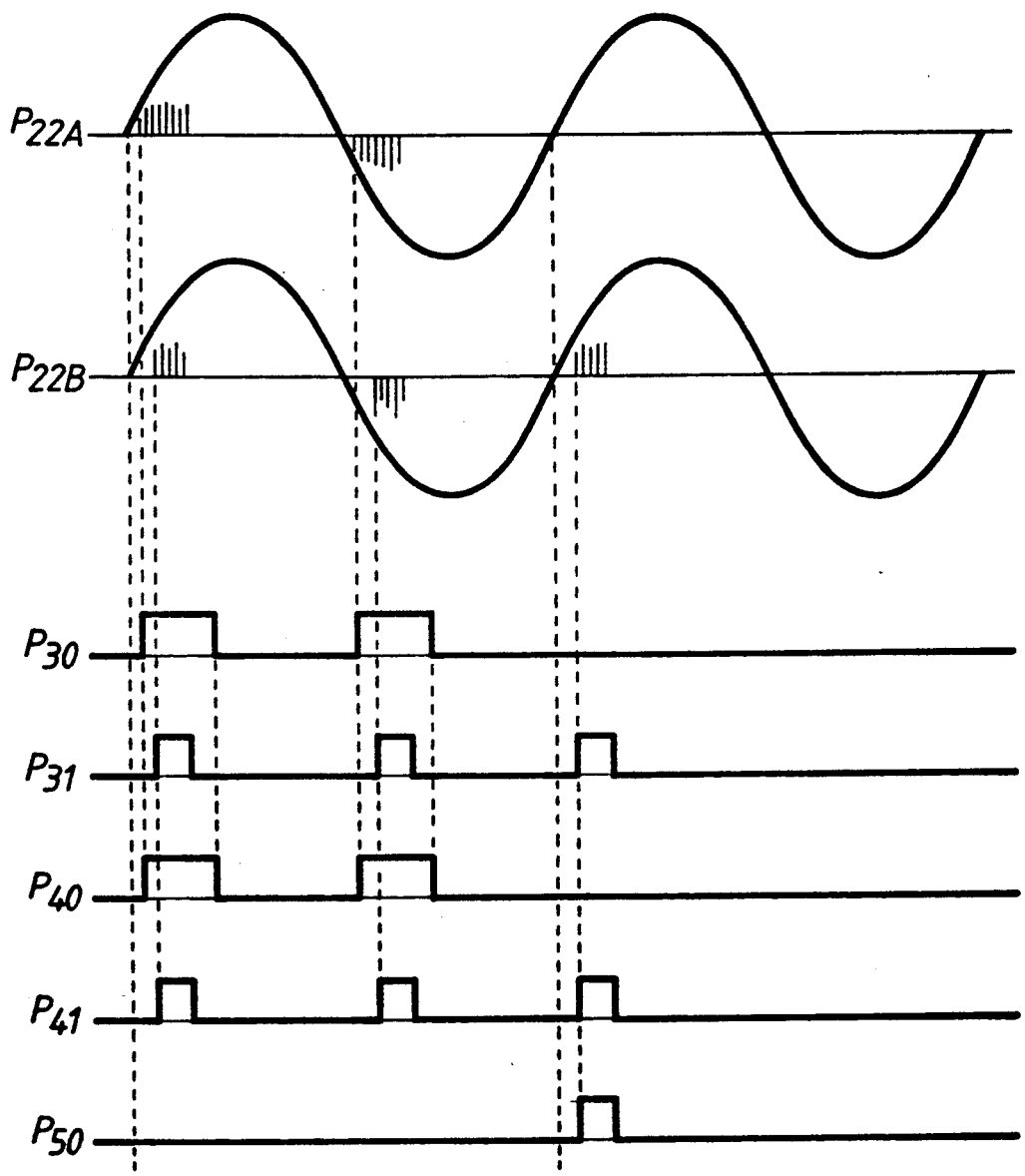
FIG. 7 is a diagram of the waveforms given in explanation of the operation of the second embodiment shown in FIG. 6.

An explanation of the operation of the second embodiment shown in FIG. 6 will be given to reference to FIGS. 7 and 8. Referring first to FIG. 7, there is shown a diagram similar to FIG. 4A given an explanation of the operation of the first embodiment, but pulse signals of pulse timing signal $P_2$ have been omitted for brevity. Signal $P_{22A}$ illustrates the fundamental wave having external noise detected by first high-frequency detecting device 22A. Units 47A, 48A, 49A, 50A, produce pulse signal $P_{30}$ which is input to A/D converter 51A. It is evident that signal $P_{30}$ provides both magnitude and phase information in relation to the fundamental wave of the noise detected by first high-frequency noise detecting device 22A.

Second high-frequency detection device 22B connected to bushing part 12B detects the pulse signals on the fundamental wave which corresponds to signal $P_{22B}$. Similarly, second detected signal processing device 25B and units 47B, 48B, 49B and 50B of partial discharge ascertaining device 26 produce signal $P_{31}$ which provides magnitude and phase information of the pulse signals detected by second high-frequency detection device 22B. Signal $P_{31}$ is input to A/D converter 51B in response to signal $P_2$ output from computing element 74.

Figure 8:
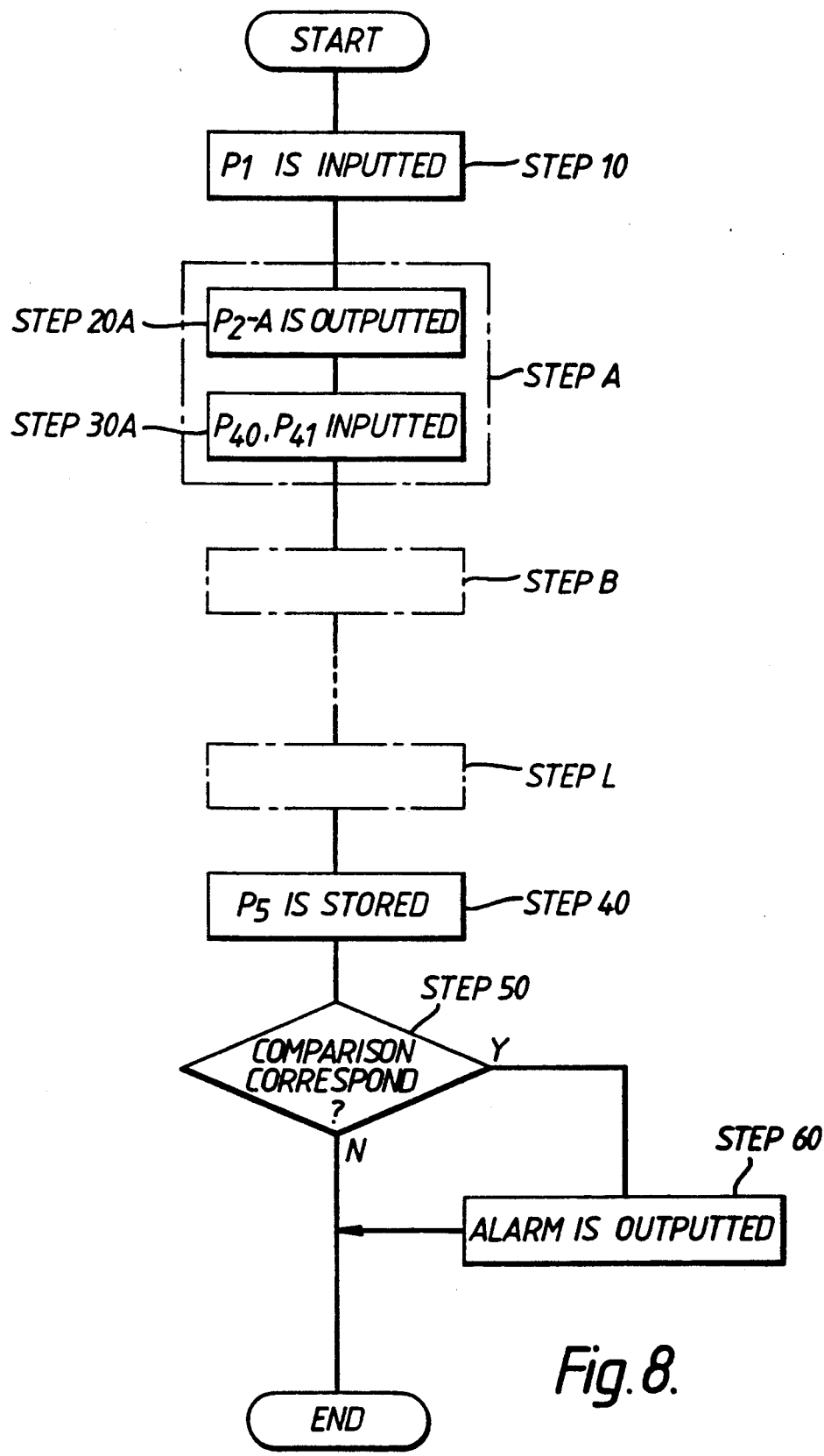
FIG. 8 is a flow chart of the operation of the second embodiment according to the invention.

Referring now to FIG. 8, where a flow diagram of the operation of the second embodiment shown in FIG. 6 is illustrated, in step 10 signal $P_1$ is inputted to computing device 74. Upon receiving signal $P_1$, computing element 74 outputs pulse timing signal $P_2$-A during step 20A of Step A. In step 30A, signals $P_{30}$ and $P_{31}$ are converted by A/O converters 51A and 51B, respectively, into digital signals $P_{40}$ and $P_{41}$, which are inputted to computing element 74. During each of the subsequent steps B-L, pulse signals $P_{40}$ and $P_{41}$ which correspond to the digitized values of pulse signals $P_{30}$ and $P_{31}$ are input to computing element 74 in response to pulse signals $P_2$-B to $P_2$-L. The operation of the second embodiment is similar to that of the first embodiment up to this point. Computing element 74 compares the input signals $P_{40}$ and $P_{41}$ and cancels the partial discharge pulses of signal $P_{41}$ which are detected at the same time as the noise pulses of signal $P_{40}$ to produce signal $P_{50}$ which is stored in computing elements 74 and compared to patterns in the same manner of the first embodiment (step 40). If the signal $P_{50}$ corresponds to one of the known discharge patterns (such as those shown in FIG. 2), the result is displayed and an alarm signal is generated using display device and alarm 60. On the other hand, if the signal $P_{50}$ does not correspond to one of the patterns, the measuring cycle ends.

Similar to the operation of the first embodiment shown in FIG. 3, based on pulse signal $P_1$ indicating the starting point for the voltage, computing element 74 outputs instrumentation timing pulse signal $P_2$ to A/D converters 51A and 51B respectively. In this case, by making the time width of instrumentation timing pulses of timing pulse signal $P_2$ smaller to a certain extent, for example 1 ms to a few ms, pulse signals $P_{40}$ and $P_{41}$ are input to computing element 74 practically simultaneously. Similar to signal $P_4$, signals $P_{40}$, $P_{41}$ and $P_{50}$ are shown for convenience of explanation and do not represent the actual shape of the digital signal input to computing element 74. Any pulse signal $P_{41}$ which is input into computing element 74 is cancelled while pulse signal $P_{40}$ is also present at computing element 74. Detection of partial discharge due to external noise is therefore not performed. In this way, it is possible to prevent introduction of spurious causes when external noise is generated. The accuracy of measurement when partial discharge signals from inside the gas-insulated switchgear overlap in time with external noise generation can thereby be further improved. Apart from this, the same action and benefits as in the embodiment shown in FIG. 3 are also obtained.

In the first embodiment shown in FIG. 3 and the second embodiment shown in FIG. 6, the case was illustrated in which floating electrode 4 was provided within the insulation spacer. However, so long as this electrode is in an insulated floating condition, it could be embedded in the interior of the earthen metal enclosure.

As described above, with this invention, by taking into consideration the reasons for occurrence and correlative relationship of partial discharge with the phase of the fundamental wave component of the voltage that is applied to the gas-insulated switchgear, a partial discharge detection signal can be measured at the phase of the fundamental waveform of the voltage that has, for example, the highest probability of corresponding to a cause of partial discharge. The probability of mistaking noise for a partial discharge signal is therefore greatly reduced, making it possible to measure partial discharge accurately and with high reliability. Furthermore, phase analysis of partial discharge with respect to the fundamental waveform of the voltage becomes possible, and by collating the measured values and measured phase with said correlative relationship, the causes of occurrence of partial discharge can be elucidated.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for detecting partial discharge generated in an interior of a gas-insulated switchgear used in a transformer installation, comprising the following steps:

detecting a high-frequency component of a voltage applied to a conductor of said gas-insulated switchgear;

detecting a fundamental wave component of the voltage applied to the conductor of said gas-insulated switchgear;

determining whether said partial discharge gas has occurred, and a reason for said partial discharge, based upon a relationship between said high-frequency component and said fundamental wave component of the voltage applied to the conductor of said gas-insulated switchgear;

frequency modulating said detected high frequency component and said fundamental wave component;

converting said frequency-modulated high-frequency component and said frequency-modulated fundamental wave component into respective first and second optical signals;

outputting said first and second optical signals into a fiberoptic network;

receiving said first and second optical signals from said fiberoptic network and converting said first and second optical signals into first and second frequency-modulated signals;

converting said first and second frequency-modulated signals into first and second pulse signals;

outputting said second pulse signal to a computing element;

converting said first pulse signal into a digital signal and inputting said digital signal to said computing element in response to said computing element receiving said second pulse signal; and comparing said digital signal with digital signals representing known patterns of said partial discharge, and determining said partial discharge has occurred and said reason for said occurrence of said partial discharge if said digital signal corresponds with at least one of said digital signals representing said known patterns of said partial discharge.

2. A system for detecting partial discharge generated in an interior of a gas-insulated switchgear used in a transformer installation, comprising:

high-frequency detection means for detecting a high-frequency component of a voltage applied to said gas-insulated switchgear;

fundamental wave detection means for detecting the fundamental wave component of the voltage applied to one gas-insulated switchgear;

voltage starting-point setting means for detecting a zero-crossing point of the fundamental wave component obtained by said fundamental wave detection means, and setting a starting point based upon said zero-crossing point;

detected signal processing means for performing signal processing on a first output signal of said high-frequency detection means and a second output signal of said voltage starting-point setting means, and outputting respective first and second optical signals corresponding to said first and second output signals; and partial discharge decision means for converting said first and second optical signals from said detected signal processing means into respective first and second pulse signals and ascertaining an occurrence of partial discharge and a reason for the occurrence of partial discharge, based on said first and second pulse signals;

wherein said partial discharge decision means comprises:

converter means for converting said second pulse signal into a digital signal; and computing means for outputting a timing pulse signal upon receipt of said first pulse signal;

wherein said timing pulse signal is output to said converting means which outputs said digital signal to said computing means upon receiving said timing pulse signal; and said computing means compares said digital signal with known reference patterns corresponding to patterns of partial discharge and outputs a signal indicating occurrence of partial discharge when said digital signal corresponds to at least one of said known reference patterns.

3. A system as recited in claim 2, wherein said computing means further comprises memory means for storing said digital signal and said known patterns of partial discharge.

4. A system as recited in claim 2, wherein said computing means comprises means for producing said timing pulse signal as a series of consecutive pulse signals over a single cycle of said fundamental wave component.

5. A system for detecting partial discharge generated in an interior of a gas-insulated switchgear used in a transformer installation, comprising:

high-frequency detection means for detecting a high-frequency component of a voltage applied to said gas-insulated switchgear;

fundamental wave detection means for detecting the fundamental wave component of the voltage applied to said gas-insulated switchgear;

voltage starting-point setting means for detecting a zero-crossing point of the fundamental wave component obtained by said fundamental wave detection means, and setting a starting point based upon said zero-crossing point;

detected signal processing means for performing signal processing on a first output signal of said high-frequency detection means and a second output signal of said voltage starting-point setting means, and outputting respective first and second optical signals corresponding to said first and second output signals; and partial discharge decision means for converting said first and second optical signals from said detected signal processing means into respective first and second pulse signals and ascertaining an occurrence of partial discharge and a reason for the occurrence of partial discharge, based on said first and second pulse signals;

wherein said high-frequency detection means comprises:

a first band-pass filter for extracting said high-frequency component of said voltage and outputting a first signal; and a first amplifier for amplifying said first signal;

wherein said fundamental wave detection means comprises:

a second band-pass filter for extracting said fundamental wave component and outputting a second signal; and a second amplifier for amplifying said second signal;

wherein said voltage starting-point setting means comprises:

a comparator for detecting said zero-crossing point of said fundamental wave component using said amplified second signal, and outputting a third signal; and pulse shaping means for pulse shaping said third signal and outputting a fourth signal; and wherein said detected signal processing means comprises:

detecting means for detecting said high-frequency component using said amplified first signal and for outputting a fifth signal;

peak hold means for converting said fifth signal into a fixed pulse width signal;

first frequency modulating means for frequency modulating said fixed pulse width signal; and first optical converter means for converting said frequency-modulated fixed pulse width signal into said first optical signal;

second frequency modulating means for frequency modulating said fourth signal; and second optical converter means for converting said frequency-modulated fourth signal into said second optical signal.

6. A system for detecting partial discharge generated in an interior of a gas-insulated switchgear used in a transformer installation, comprising:

high-frequency detection means for detecting a high-frequency component of a voltage applied to said gas-insulated switchgear;

fundamental wave detection means for detecting the fundamental wave component of the voltage applied to said gas-insulated switchgear;

voltage starting-point setting means for detecting a zero-crossing point of the fundamental wave component obtained by said fundamental wave detection means, and setting a starting point based upon said zero-crossing point;

detecting signal processing means for performing signal processing on a first output signal of said high-frequency detection means and a second output signal of said voltage starting-point setting means, and outputting respective first and second optical signals corresponding to said first and second output signals; and partial discharge decision means for converting said first and second optical signals from said detected signal processing means into respective first and second pulse signals and ascertaining an occurrence of partial discharge and a reason for the occurrence of partial discharge, based on said first and second pulse signals;

wherein said partial discharge decision means comprises:

first optical converting means for converting said first optical signal into a first frequency-modulated signal;

first frequency converting means for converting said first frequency-modulated signal into a first voltage signal;

a first amplifier for amplifying said first voltage signal;

integrating means for integrating said amplified first voltage signal and outputting said first pulse signal second optical converting means for converting said second optical signal into a second frequency-modulated signal;

second frequency modulating means for converting said second frequency-modulated signal into a second voltage signal;

a second amplifier for amplifying said second voltage signal;

waveform shaping means for producing said second pulse signal using said amplified second voltage signal;

converter means for converting said first pulse signal into a digital signal; and computing means for outputting a pulse timing signal upon reception of said first pulse signal from said waveform shaping means to said converter means, said converter means outputting said digital signal to said computing means, and for determining said occurrence and said reason for said occurrence of partial discharge using said digital signal.

7. A method for detecting partial discharge generated in an interior of a gas-insulated switchgear used in a transformer installation, comprising the following steps:

detecting a first high-frequency component of a voltage applied to a conductor of said gas-insulated switchgear due to noise superimposed on said voltage;

detecting a second high-frequency component of said voltage applied to said conductor of said gas-insulated switchgear due to said partial discharge in said interior of said gas-insulated switchgear;

detecting a fundamental wave component of said voltage applied to said conductor of said gas-insulated switchgear; and determining whether said partial discharge has occurred, and a reason for said partial discharge, based upon a relationship between said first and second high-frequency components and said fundamental wave component of said voltage applied to said conductor of said gas-insulated switchgear;

wherein said determining steps comprises:

detecting a zero-crossing point of said fundamental wave component, said zero crossing point being a starting point of said voltage;

determining a first pattern of said first high-frequency component in terms of a phase relationship with said fundamental wave component using said starting point;

determining a second pattern of said second high-frequency component in terms of said phase relationship with said fundamental wave component using said starting point;

determining a third pattern by cancelling portions of said second pattern which overlap said first pattern;

comparing said third pattern with known patterns of said partial discharge; and determining said partial discharge has occurred and said reason for said occurrence of said partial discharge if said third pattern corresponds with at least one of said known patterns.

8. A system for detecting partial discharge generated in the interior of a gas-insulated switchgear used in a transformer installation, comprising:

first high-frequency detection means, provided at a bushing of said gas-insulated switchgear, for detecting a first high-frequency component superimposed on the voltage applied to the conductor of said gas-insulated switchgear, caused by external noise entering said gas-insulated switchgear;

second high-frequency detection means, provided at a central location of said gas-insulated switchgear, for detecting a second high-frequency component superimposed on the voltage applied to the conductor of said gas-insulated switchgear, caused by partial discharge in said interior of said gas-insulated switchgear;

fundamental wave detection means for detecting a fundamental wave component of said voltage applied to said conductor of said gas-insulated switchgear;

voltage starting-point setting means for detecting a zero-crossing point of said fundamental wave component obtained by said fundamental wave detection means, and setting a starting point based upon said zero-crossing point;

detected signal processing means for performing signal processing on a first output signal of said first high-frequency detection means, a second output signal of said second high-frequency detection means, and a third output signal of said voltage starting-point setting means, and outputting respective first, second and third optical signals corresponding to said first, second and third output signals; and partial discharge decision means for converting said first, second and third optical signals from said detected signal processing means into respective first, second and third pulse signals and ascertaining an occurrence of partial discharge and a reason for said occurrence of partial discharge, based on a relationship between said first, second and third pulse signals;

wherein said partial discharge decision means comprises:

first converter means for converting said first pulse signal into a first digital signal;

second converter means for converting said second pulse signal into a second digital signal; and computing means for outputting a timing pulse signal upon receiving said third pulse signal to said first and second converting means which respectively output said first and second digital signals to said computing means upon receipt of said timing pulse signal, for cancelling portions of said second digital signal which are input to said computing means substantially simultaneously with said first digital signal and storing remaining portions of said second digital signal, for comparing said stored portions of said second digital signal with known reference patterns corresponding to patterns of partial discharge, and for outputting an occurrence of partial discharge signal and a reason for said occurrence of partial discharge when said stored portions of said second digital signal corresponds to at least one of said known reference patterns.

9. A system as recited in claim 8, wherein said computing means further comprises memory means for storing said portions of said second digital signal and said known patterns of partial discharge.

10. A system as recited in claim 8, wherein said computing means comprises means for producing said timing pulse signal as a series of consecutive pulse signals over a single cycle of said fundamental wave component.

11. A system for detecting partial discharge generated in the interior of a gas-insulated switchgear used in a transformer installation, comprising:

first high-frequency detection means, provided at a bushing of said gas-insulated switchgear, for detecting a first high-frequency component superimposed on the voltage applied to the conductor of said gas-insulated switchgear, caused by external noise entering said gas-insulated switchgear;

second high-frequency detection means, provided at a central location of said gas-insulated switchgear, for detecting a second high-frequency component superimposed on the voltage applied to the conductor of said gas-insulated switchgear, caused by partial discharge in said interior of said gas-insulated switchgear;

fundamental wave detection means for detecting a fundamental wave component of said voltage applied to said conductor of said gas-insulated switchgear;

voltage starting-point setting means for detecting a zero-crossing point of said fundamental wave component obtained by said fundamental wave detection means, and setting a starting point based upon said zero-crossing point;

detected signal processing means for performing signal processing on a first output signal of said first high-frequency detection means, a second output signal of said second high-frequency detection means, and a third output signal of said voltage starting-point setting means, and outputting respective first, second and third optical signals corresponding to said first, second and third output signals; and partial discharge decision means for converting said first, second and third optical signals from said detected signal processing means into respective first, second and third pulse signals and ascertaining an occurrence of partial discharge and a reason for said occurrence of partial discharge, based on a relationship between said first, second and third pulse signal;

wherein said first high-frequency detection means comprises:
 first band-pass filter for extracting said first high-frequency component of said voltage and outputting a first signal; and
 a first amplifier for amplifying said first signal;

wherein said second high-frequency detection means comprises:
 a second band-pass filter for extracting said second high-frequency component of said voltage and outputting a second signal; and
 a second amplifier for amplifying said second signal;

wherein said fundamental wave detection means comprises:

a third band-pass filter for extracting said fundamental wave component and outputting a third signal; and
a third amplifier for amplifying said third signal;

wherein said voltage starting-point setting means comprises:
 a comparator for detecting said zero-crossing point of said fundamental wave component using said amplified third signal, and outputting a fourth signal; and
 pulse shaping means for pulse shaping said fourth signal and outputting a fifth signal; and wherein said detected signal processing means comprises:

first detecting means for detecting said first high-frequency component using said amplified first signal and for outputting a sixth signal;

first peak hold means for converting said sixth signal into a first fixed pulse width signal;

first frequency modulating means for frequency modulating said first fixed pulse width signal;

first optical converter means for converting said frequency modulated first fixed pulse width signal into said first optical signal;

second detecting means for detecting said second high-frequency component using said amplified first signal and for outputting a seventh signal;

second peak hold means for converting said seventh signal into a second fixed pulse width signal;

second frequency modulating means for frequency modulating said second fixed pulse width signal;

second optical converter means for converting said frequency modulated second fixed pulse width signal into said second optical signal;

third frequency modulating means for frequency modulating said fifth signal; and third optical converter means for converting said frequency-modulated fifth signal into said third optical signal.

12. A system as recited in claim 11, comprising:
said first bandpass filter having a first bandpass frequency; and
said second bandpass filter having a second bandpass frequency lower than said first bandpass frequency.

13. A system for detecting partial discharge generated in the interior of a gas-insulated switchgear used in a transformer installation, comprising:

first high-frequency detection means, provided at a bushing of said gas-insulated switchgear, for detecting a first high-frequency component superimposed on the voltage applied to the conductor of said gas-insulated switchgear, caused by external noise entering said gas-insulated switchgear;

second high-frequency detection means, provided at a central location of said gas-insulated switchgear, for detecting a second high-frequency component superimposed on the voltage applied to the conductor of said gas-insulated switchgear, caused by partial discharge in said interior of said gas-insulated switchgear;

fundamental wave detection means for detecting a fundamental wave component of said voltage applied to said conductor of said gas-insulated switchgear;

voltage starting-point setting means for detecting a zero-crossing point of said fundamental wave component obtained by said fundamental wave detection means, and setting a starting point based upon said zero-crossing point;

detected signal processing means for performing signal processing on a first output signal of said first high-frequency detection means, a second output signal of said second high-frequency detecting means, and a third output signal of said voltage starting-point setting means, and outputting respective first, second and third optical signals corresponding to said first, second and third output signals; and partial discharge decision means for converting said first, second and third optical signals from said detected signal processing means into respective first, second and third pulse signals and ascertaining an occurrence of partial discharge and a reason for said occurrence of partial discharge, based on a relationship between said first, second and third pulse signals;

wherein said partial discharge decision means comprises:

first optical converting means for converting said first optical signal into a first frequency-modulated signal;

first frequency converting means for converting said first frequency-modulated signal into a first signal;

a first amplifier for amplifying said first signal;

first integrating means for integrating said amplified first signal and outputting said first pulse signal;

second optical converting means for converting said second optical signal into a second frequency-modulated signal;

second frequency converting means for converting said second frequency-modulated signal into a second signal;

a second amplifier for amplifying said second signal;

second integrating means for integrating said amplified second signal and outputting said first pulse signal;

third optical converting means for converting said third optical signal into a third frequency-modulated signal;

third frequency converting means for converting said third frequency-modulated signal into a third signal;

a third amplifier for amplifying said third signal;

waveform shaping means for producing said third pulse signal using said amplified second voltage signal; and computing means for outputting a pulse timing signal upon receiving said third pulse signal from said waveform shaping means to said first and second converter means which respectively output said first and second digital signals to said computing means, and for determining said occurrence of partial discharge and said reason for said occurrence using said digital signal.

14. A method for detecting partial discharge generated in an interior of a gas-insulated switchgear used in a transformer installation, comprising the following steps:

detecting a first high-frequency component of a voltage applied to a conductor of said gas-insulated switchgear due to noise superimposed on said voltage;

detecting a second high-frequency component of said voltage applied to said conductor of said gas-insulated switchgear due to said partial discharge in said interior of said gas-insulated switchgear;

detecting a fundamental wave component of said voltage applied to said conductor of said gas-insulated switchgear;

determining whether said partial discharge has occurred, and a reason for said partial discharge, based upon a relationship between said first and second high-frequency components and said fundamental wave component of said voltage applied to said conductor of said gas-insulated switchgear;

detecting a zero-crossing point of said fundamental wave component, said zero-crossing point being a starting point of said voltage;

detecting respective magnitudes of said first and second high-frequency components and respective phase relationships of said first and second high-frequency component in relation to said starting point of said voltage;

determining respective first and second patterns of said first and second high-frequency components using both of said respective magnitudes of said first and second high-frequency components and said respective phase relationships of said first and second high-frequency components in relation to said starting point of said voltage;

constructing a third pattern by cancelling portions of said second pattern which overlap said first pattern;

comparing said third pattern with known patterns of said partial discharge; and determining said partial discharge has occurred and said reason for said occurrence of said partial discharge if said third pattern corresponds with at least one of said known patterns.

15. A method for detecting partial discharge generated in an interior of a gas-insulated switchgear used in a transformer installation, comprising the following steps:

detecting a first high-frequency component of a voltage applied to a conductor of said gas-insulated switchgear due to noise superimposed on said voltage;

detecting a second high-frequency component of said voltage applied to said conductor of said gas-insulated switchgear due to said partial discharge in said interior of said gas-insulated switchgear;

detecting a fundamental wave component of said voltage applied to said conductor of said gas-insulated switchgear; and determining whether said partial discharge has occurred, and a reason for said partial discharge, based upon a relationship between said first and second high-frequency components and said fundamental wave component of said voltage applied to said conductor of said gas-insulated switchgear;

wherein said determining step comprises:

detecting a zero-crossing point of said fundamental wave component, said zero crossing point being a starting point of said voltage, said voltage being a periodic voltage having a predetermined cycle;

detecting an occurrence of said first and second high-frequency components for a predetermined number of periods during said cycle of said voltage;

constructing respective first and second patterns representing respective occurrences of said first and second high-frequency components during said periods;

constructing a third pattern by cancelling portions of said second pattern which overlap said first pattern;

comparing said third pattern with known patterns of said partial discharge; and determining said partial discharge has occurred and said reason for said occurrence of said partial discharge if said third pattern corresponds with at least one of said known patterns.

16. A method for detecting partial discharge generated in an interior of a gas-insulated switchgear used in a transformer installation, comprising the following steps:

detecting a first high-frequency component of a voltage applied to a conductor of said gas-insulated switchgear due to noise superimposed on said voltage;

detecting a second high-frequency component of said voltage applied to said conductor of said gas-insulated switchgear due to said partial discharge in said interior of said gas-insulated switchgear;

detecting a fundamental wave component of said voltage applied to said conductor of said gas-insulated switchgear;

determining whether said partial discharge has occurred, and a reason for said partial discharge, based upon a relationship between said first and second high-frequency components and said fundamental wave component of said voltage applied to said conductor of said gas-insulated switchgear;

frequency modulating said detected first and second high-frequency components and said fundamental wave component;

converting said frequency-modulating first and second high-frequency components and said frequency-modulated fundamental wave component into respective first, second and third optical signals;

outputting said first, second and third optical signals into a fiberoptic network;

receiving said first, second and third optical signals from said fiberoptic network and converting said first, second and third optical signals into first, second and third frequency-modulated signals;

converting said first, second and third frequency-modulated signals into first, second and third pulse signals;

outputting said third pulse signal to a computing element;

converting said first and second pulse signals into respective first and second digital signals and inputting said first and second digital signals to said computing element in response to said computing element receiving said third pulse signal; and constructing a third digital signal by cancelling portions of said second digital signal which overlap said first digital signal, comparing said third digital signal with digital signals representing known patterns of said partial discharge, and determining said partial discharge has occurred and said reason for said occurrence of said partial discharge if said third digital signal corresponds with at least one of said digital signal representing said known patterns of said partial discharge using said computing element.

* * * * *